United States Patent
Iyoshi

(10) Patent No.: US 9,893,007 B2
(45) Date of Patent: Feb. 13, 2018

(54) PACKAGED SEMICONDUCTOR DEVICES WITH MULTI-USE INPUT CONTACTS AND RELATED METHODS

(71) Applicant: SEMICONDUCTOR COMPONENTS INDUSTRIES, LLC, Phoenix, AZ (US)

(72) Inventor: Kentaro Iyoshi, Gyoda (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/139,649

(22) Filed: Apr. 27, 2016

(65) Prior Publication Data
US 2017/0317021 A1    Nov. 2, 2017

(51) Int. Cl.
  *G05B 19/18*   (2006.01)
  *H01L 23/50*   (2006.01)
  *H02P 27/08*   (2006.01)
  *H03M 1/12*    (2006.01)

(52) U.S. Cl.
  CPC ............ *H01L 23/50* (2013.01); *H02P 27/085* (2013.01); *H03M 1/12* (2013.01)

(58) Field of Classification Search
  CPC ............. G05B 11/28; H02P 7/29; H02P 6/085
  USPC ...... 318/599, 811, 569, 600, 461; 388/807.5
  See application file for complete search history.

(56) References Cited

U.S. PATENT DOCUMENTS

| | | | | |
|---|---|---|---|---|
| 7,067,998 B2 * | 6/2006 | Karwath | ................... | H02P 6/06 318/400.14 |
| 7,355,362 B2 * | 4/2008 | Pai | ......................... | G06F 1/206 318/432 |
| 7,483,270 B2 * | 1/2009 | Blake | ..................... | F04D 27/004 361/679.48 |
| 7,564,204 B2 * | 7/2009 | Ogino | .................... | H02P 7/2913 318/400.01 |
| 7,589,485 B2 * | 9/2009 | Yoshitomi | ................ | H02P 6/08 318/400.37 |
| 8,618,763 B2 * | 12/2013 | Noie | ........................ | H02P 6/20 318/599 |
| 8,736,214 B2 * | 5/2014 | Yoshitomi | ................ | H02P 6/22 315/112 |

\* cited by examiner

*Primary Examiner* — Rina Duda
(74) *Attorney, Agent, or Firm* — IPTechLaw

(57) ABSTRACT

A semiconductor device includes a first contact receiving a first voltage, a second contact receiving a second voltage, one or more comparing elements comparing the first and second voltages, and one or more setting elements setting one or more parameters of the device in response to a comparison of the first and second voltages. When the first voltage is greater than the second voltage the setting element selects the first voltage as a high voltage, the second voltage as a low voltage, and sets a mode signal to a first value. When the second voltage is greater than the first voltage the setting element selects the first voltage as the low voltage, the second voltage as the high voltage, and sets the mode signal to a second value. The first and second values alter a condition of an electronic component coupled with the device between a first and second state.

18 Claims, 10 Drawing Sheets

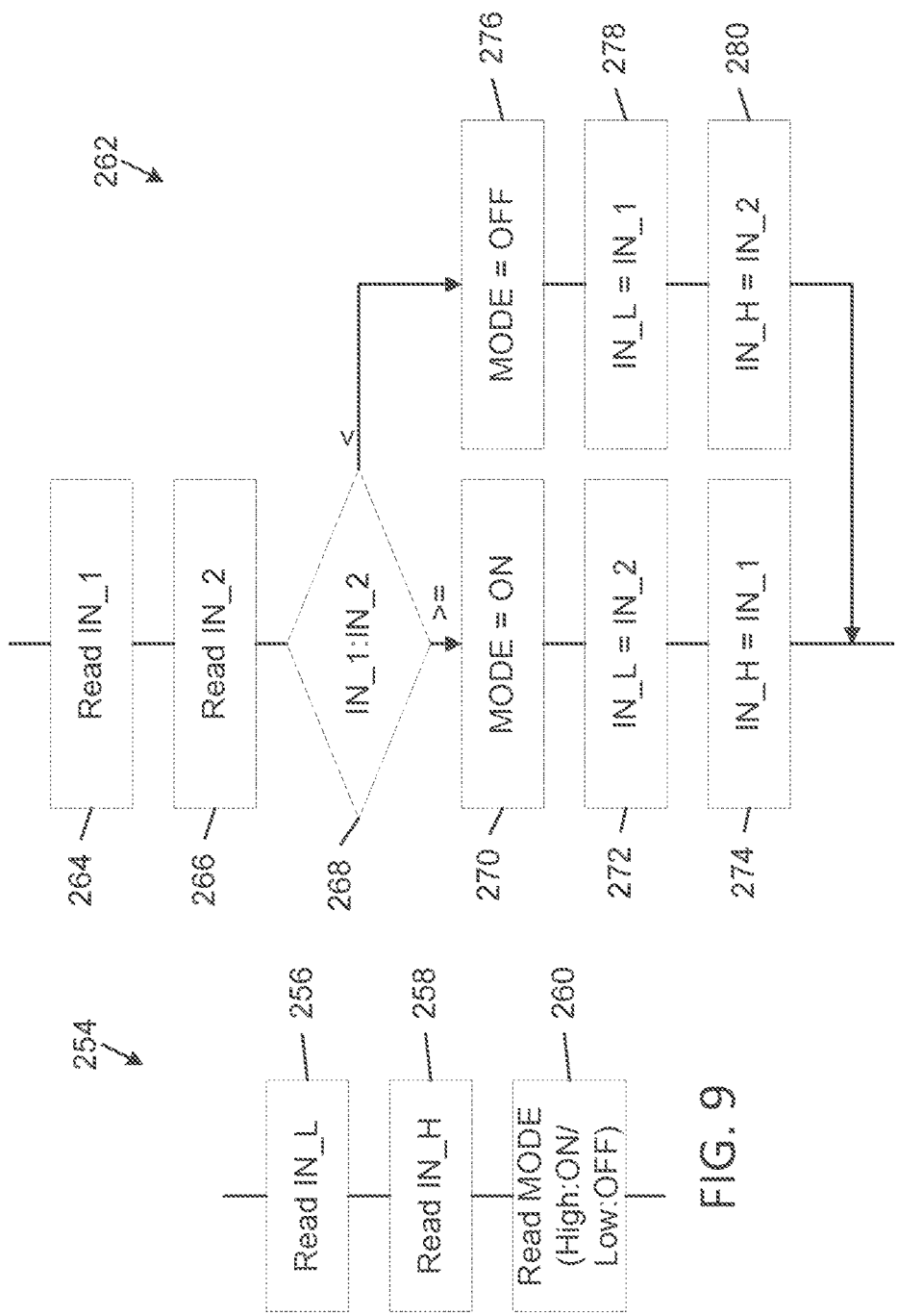

PACKAGED SEMICONDUCTOR DEVICES WITH MULTI-USE INPUT CONTACTS AND RELATED METHODS

BACKGROUND

1. Technical Field

Aspects of this document relate generally to packaged semiconductor devices.

2. Background

Packaged semiconductor devices (packages) exist in many varieties and often include some type of molding or casing, such as formed of a polymer or ceramic, with one or more electrical contacts exposed on an outside surface (or extending through) the molding or casing. The electrical contacts may be used for a variety of purposes, such as for coupling a power source with one or more elements internal or external to the package, providing a signal to one or more elements internal or external to the package, and/or coupling one or more other elements internal and/or external to the package together.

SUMMARY

Implementations of packaged semiconductor devices (devices) may include: a first input contact configured to receive a first input voltage; a second input contact configured to receive a second input voltage; one or more comparing elements configured to compare the first input voltage with the second input voltage, and; one or more setting elements configured to set one or more operating parameters of the device in response to a comparison of the first input voltage and the second input voltage by the one or more comparing elements; wherein, in response to the first input voltage being greater than the second input voltage, the one or more setting elements are configured to select the first input voltage as a high input voltage, select the second input voltage as a low input voltage, and set a mode signal of the device to a first value, and; wherein, in response to the second input voltage being greater than the first input voltage, the one or more setting elements are configured to select the first input voltage as the low input voltage, select the second input voltage as the high input voltage, and set the mode signal to a second value; wherein the first value and the second value of the mode signal are configured to alter an operating condition of an electronic component coupled with the device between a first state and a second state, respectively.

Implementations of packaged semiconductor devices (devices) may include one, all, or any of the following:

The one or more comparing elements may include a comparator.

The one or more setting elements may include one or more switches and one or more inverters.

The one or more setting elements may include one or more multiplexers.

One or more analog-to-digital converters (ADCs) may be included to convert the high input voltage into a high input digital signal and the low input voltage into a low input digital signal.

The first input contact and the second input contact may each be coupled with a first multiplexer, the first multiplexer may be coupled with an analog-to-digital converter (ADC), the ADC may be coupled with a register, and the register may be coupled with a comparator and with a second multiplexer and a third multiplexer, the second multiplexer and third multiplexer being controlled by an output of the comparator.

The device may include a fan controller and may have a third input contact, configured to be coupled with a power supply, and an output contact configured to output an output voltage to power a fan, the high input voltage may be configured to set a high value for the output voltage corresponding with a high fan speed, the low input voltage may be configured to set a low value for the output voltage corresponding with a low fan speed, and the mode signal may be configured to determine whether the fan stops in response to the output voltage dropping below the low value.

The device may be configured to set three operating parameters of the device using no input contacts except the first input contact and the second input contact.

Implementations of packaged semiconductor devices (devices) may include: a first input contact configured to receive a first input voltage; a second input contact configured to receive a second input voltage; a third input contact configured to receive a third input voltage; one or more comparing elements configured to compare the first input voltage, the second input voltage, and the third input voltage (the input voltages), and one or more setting elements configured to, in response to a comparison of the input voltages by the one or more comparing elements, select one of the input voltages as a high input voltage, select another of the input voltages as a medium input voltage, and select another of the input voltages as a low input voltage; wherein the one or more setting elements are further configured to vary values of one or more mode signals of the device in response to which of the input voltages is selected as the high input voltage, which of the input voltages is selected as the medium input voltage, and which of the input voltages is selected as the low input voltage; wherein the values of the one or more mode signals are configured to alter an operating condition of an electronic component coupled with the device between one or more states.

Implementations of packaged semiconductor devices (devices) may include one, all, or any of the following:

The one or more mode signals may include three mode signals, and the one or more setting elements may be configured to vary the three mode signals between two values each in response to which of the input voltages is selected as the high input voltage, which of the input voltages is selected as the medium input voltage, and which of the input voltages is selected as the low input voltage.

The one or more setting elements may be configured to vary one of the one or more mode signals between six values in response to which of the input voltages is selected as the high input voltage, which of the input voltages is selected as the medium input voltage, and which of the input voltages is selected as the low input voltage.

The device may be configured to set six operating parameters of the device using no input contacts except the first input contact, the second input contact, and the third input contact.

One or more analog-to-digital converters (ADCs) may be coupled between the one or more comparing elements and the input voltages, and the one or more comparing elements may compare digital values of the input voltages.

The one or more comparing elements may include three comparators, and each of the first input contact, the second input contact and the third input contact (the input contacts) may be coupled with inputs of two of the three comparators, and each input contact may further be coupled with inputs of three multiplexers, and a decoder may be configured to control the three multiplexers in response to receiving outputs of the three comparators, and the input voltages may be coupled with one or more analog-to-digital converters.

Each of the input voltages may be coupled with an input of a multiplexer, an output of the multiplexer may be coupled with an analog-to-digital converter (ADC), an output of the ADC may be coupled with a first register to store ADC output values therein, a controller may be coupled with the multiplexer and may be configured to control the multiplexer, the controller may be configured to compare the stored ADC output values from the first register to select the high input voltage, the medium input voltage, the low input voltage, and one or more of the values of the one or more mode signals, and the controller may be configured to store values associated with the high input voltage, the medium input voltage, the low input voltage, and the one or more mode signals in a second register.

Implementations of methods of use of packaged semiconductor devices (devices) may include: applying a first input voltage to a first input contact; applying a second input voltage to a second input contact; comparing the first input voltage with the second input voltage (the input voltages) using one or more comparing elements of the device; using one or more setting elements, selecting one of the input voltages as a high input voltage and another of the input voltages as a low input voltage; in response to the first input voltage being selected as the high input voltage, setting a mode signal, using the one or more setting elements, to a first value, and; in response to the second input voltage being selected as the high input voltage, setting the mode signal, using the one or more setting elements, to a second value different from the first value.

Implementations of methods of use of packaged semiconductor devices (devices) may include one, all, or any of the following:

Setting three operating parameters of the device using no input contacts except the first input contact and the second input contact, the three operating parameters being configured to alter an operating condition of an electronic component coupled with the device between one or more states.

Applying a third input voltage to a third input contact, the third input voltage being one of the input voltages, comparing the third input voltage with the first input voltage and the second input voltage using the one or more comparing elements and, using the one or more setting elements, selecting one of the input voltages as a medium input voltage.

Varying, using the one or more setting elements, multiple mode signals of the device, between at least two values each, in response to which of the input voltages is selected as the high input voltage, which of the input voltages is selected as the medium input voltage, and which of the input voltages is selected as the low input voltage.

Varying, using the one or more setting elements, the mode signal between at least three values in response to which of the input voltages is selected as the high input voltage, which of the input voltages is selected as the medium input voltage, and which of the input voltages is selected as the low input voltage.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 9 is a flowchart representatively illustrating a method of use of the conventional packaged semiconductor device of FIG. 3;

FIG. 10 is a flowchart representatively illustrating a method of use of the devices of FIG. 4;

DESCRIPTION

Figure 1:
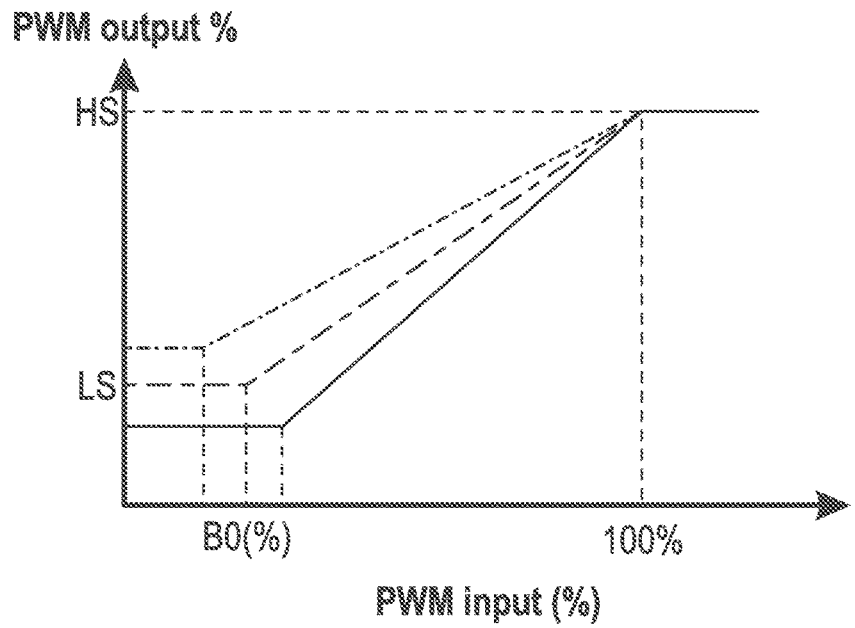
FIG. 1 is a graph illustrating behavior a conventional packaged semiconductor device.

This disclosure, its aspects and implementations, are not limited to the specific components, assembly procedures or method elements disclosed herein. Many additional components, assembly procedures and/or method elements known in the art consistent with the intended packaged semiconductor devices with multi-use input contacts and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such packaged semiconductor devices with multi-use input contacts and related methods, and implementing components and methods, consistent with the intended operation and methods.

Referring to Appendix A, the entire disclosure of which is incorporated herein by reference, a representative example of a packaged semiconductor device (device) is shown. The representative device of Appendix A is a single-phase motor driver that may be used to control fan speed of a fan using a pulse-width-modulation (PWM) input (though it could also be used to control other motor-driven elements other than a fan). As can be seen on the figure on page 1 of Appendix A, the device includes a number of electrical contacts extending outwards from a package encapsulant or covering (which in representative examples could include a polymer or a ceramic). The electrical contacts shown in Appendix A are pins, but naturally other semiconductor packages could include contacts that are not pins, and may for example include pads or contacts that are flush with an outer surface of the device, solder bumps, or even electrical contacts that are recessed in from an outer surface of the device.

Each electrical contact of the device may be configured for a specific use. Page 4 of Appendix A reveals that the representative example includes sixteen pins each having a specific use. In other implementations one or more of the pins could be unused. Some of the pins/contacts are input contacts meaning that they receive some input signal, voltage, current, or the like. For example, page 4 of Appendix A labels one pin as IN1, another as IN2, and another as PWM, and page 6 of Appendix A reveals that IN1 is a Hall input positive (+) pin, IN2 is a Hall input negative (−) pin, and PWM is an input pin for PWM control. Other devices could have other input pins or input contacts for many other purposes, and Appendix A is only used for a representative example of a packaged semiconductor device having one or more input pins for an input signal, input voltage, input current, or the like. As is clear from Appendix A, the packaged semiconductor device described therein controls or sets one or more parameters of an external electrical device or component, namely, a fan. Other packaged semiconductor devices could control other external electrical devices or components other than fans.

Appendix B, the entire disclosure of which is incorporated herein by reference, shows another representative example of a packaged semiconductor device that is also a motor driver. The device of Appendix B is a three phase brushless direct current (BLDC) fan motor driver, and the rightmost figures of page 1 of Appendix B show that the device has 20 pins, some of which are input pins as shown on pages 2 and 8 of Appendix B. Appendix C, the entire disclosure of which is incorporated herein by reference, shows another representative example of a packaged semiconductor device that is also a fan controller. The device of Appendix C is a three phase brushless motor driver and the figures of page 3 of Appendix C show that there are 28 total pins, with their functions described in the table beginning on page 6 of Appendix C, including several pins that are input pins. Naturally, the more complex a semiconductor device is, such as with large scale integration (LSI) devices, the more pins/contacts may be needed to set various parameters.

Appendices A-C are used to show various representative examples of packaged semiconductor devices that include electrical contacts or pins, including input contacts or pins. As may be understood by the practitioner of ordinary skill in the art, the use of more pins/contacts may allow for increased functionality, greater control, higher performance, etc., including the ability to alter more parameters of the packaged semiconductor device and/or an electrical device or component controlled by the packaged semiconductor device, though this may come at the expense of increased die size, increased package size, increased outline (printed circuit board area required for placement), and the like. This may also result in increased cost.

In many industries (including but not limited to motor drivers) in which packaged semiconductor devices are used there is demand for reduction of cost and miniaturization of devices, smaller outline (PCB area required), a more compact profile, a smaller die size, a smaller package size, fewer electrical contacts/terminals, and the like. At the same time, in many industries using packaged semiconductor devices it is also desirable, in order to meet high performance demands and allow complex functions, to allow the setting of many parameters of the packaged semiconductor device and/or a device coupled with the packaged semiconductor device (which may or may not change the functionality of one or more electrical contacts and/or alter the operation of the packaged semiconductor device, an electrical device or component coupled with the packaged semiconductor device, and so forth).

To more further describe the changing of parameters or, in other words, the "setting" of parameters of a packaged semiconductor device using one or more input contacts, reference is made to FIG. 1, which shows a graph 2 representatively illustrating behavior of a conventional packaged semiconductor device, which is an open-loop direct pulse-width modulation (PWM) direct current (DC) fan controller. The graph plots pulse width modulation (PWM) output percentage versus PWM input percentage based on a number of programmable parameters. The conventional packaged semiconductor device allows programmable fan speed control using digital direct PWM input and using three external pins HS, LS, and B0. The HS pin is used for setting the highest speed (i.e., the PWM output duty cycle setting for the highest speed) or revolutions per minute (RPM), the LS pin is used for setting the lowest speed (i.e., the PWM output duty cycle setting for the lowest speed) (lowest RPM), and B0 is used to set the PWM input percentage at which a transition is made between the lowest speed and a sloped portion between the lowest and highest speed (altering the B0 value effectively alters the slope of the sloped portion, though the slope can additionally be altered by altering the HS and/or LS values). Three different plots are shown, all having the same HS value but having different LS and B0 values to show variation. There is thus a controllable range of speeds between LS and HS, in which the PWM output (and accordingly fan speed) can be varied based on the PWM input percentage.

To "set" the HS, LS and B0 values of the conventional packaged semiconductor device using the HS, LS, and B0 pins, different voltages are applied to the corresponding pins, and a manufacturer of the packaged semiconductor device may provide one or more formulas to assist a designer or end user to know what voltages to apply to the pins in order to achieve the desired HS, LS and B0 values. Different voltages may be applied using voltage dividers such as resistors outside the device package using known techniques. In the conventional packaged semiconductor device whose behavior is depicted in FIG. 1 there are three operating conditions or "parameters" of the external device (motor-driven fan) that are set using three pins of the packaged semiconductor device. The highest RPM is set by applying a voltage to the HS pin, the lowest RPM is set by applying a voltage to the LS pin, and the slope of the curve is determined by applying a voltage to the B0 pin.

The voltage applied to each pin is not necessarily the actual voltage level, or PWM level, but is a signal voltage used to determine the level. Thus, by non-limiting example, the voltages applied to the HS and LS pins could vary between 0 V and 1.0 V, with a 0 V signal corresponding to a zero PWM output percentage and 1.0 V corresponding to a 100% PWM output. Likewise, the voltage applied to the B0 pin could vary between 0 V and 1.0 V and this could move the slope transition point from a zero PWM input percentage to a 100% PWM input. Other configurations/voltage values are possible and these are only representative examples.

It is noted that in FIG. 1, when the PWM input percentage drops below the B0 value, the fan does not stop spinning but continues to spin at the lowest RPM. Thus only minimum PWM output clamp mode is supported at the lower end. The output duty is clamped to the duty percentage defined as low speed (LS) when direct PWM input is lower than B0 and the device is thus incapable of outputting zero (0) percent when LS is not set to zero. An end user may not desire this, and may instead want the fan to actually stop spinning at some PWM input percentage near or below B0.

Figure 2:
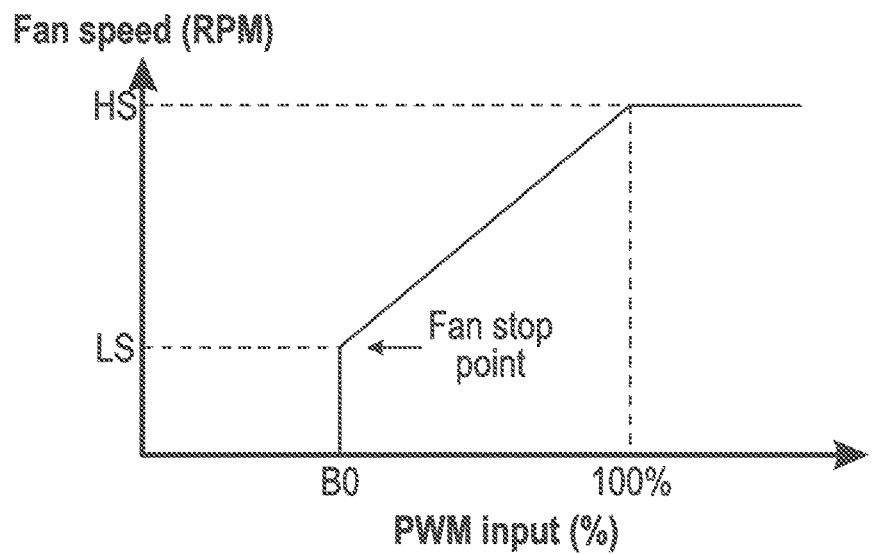
FIG. 2 is a graph illustrating behavior of another conventional packaged semiconductor device.

FIG. 2 shows a graph 4 representing a conventional packaged semiconductor device that includes the three pins HS, LS, and B0 but which causes the fan speed to always drop to zero (fan stop point) below B0 instead of being clamped at the LS fan speed below B0. A supplier or manufacturer may accordingly have different models for the different modes, such that a first model having pins HS, LS and B0 exhibits the behavior shown in FIG. 1 while a second model having the same pins exhibits the behavior shown in FIG. 2.

A manufacturer or supplier could, instead of having two models, have a single model which allows both the behavior shown in FIG. 1 and the behavior shown in FIG. 2 but which uses an additional pin (mode pin) for allowing an installer/designer or end user to set the mode at installation by providing a specified voltage at the mode pin/input. Thus, one end user may want a fan controller to operate using the behavior shown in FIG. 1 and thus may apply a first voltage to the mode pin of his fan controller, and a second user may want a fan controller to operate using the behavior shown in FIG. 2 and thus may apply a second voltage to the mode pin of her fan controller. The mode may thus be set by a designer/installer or end user to operate in one mode in which the lowest speed is maintained at PWM input percentages below B0 or a second mode in which the fan speed drops to zero below B0. Such a conventional system requires the use of 4 input pins.

Figure 3:
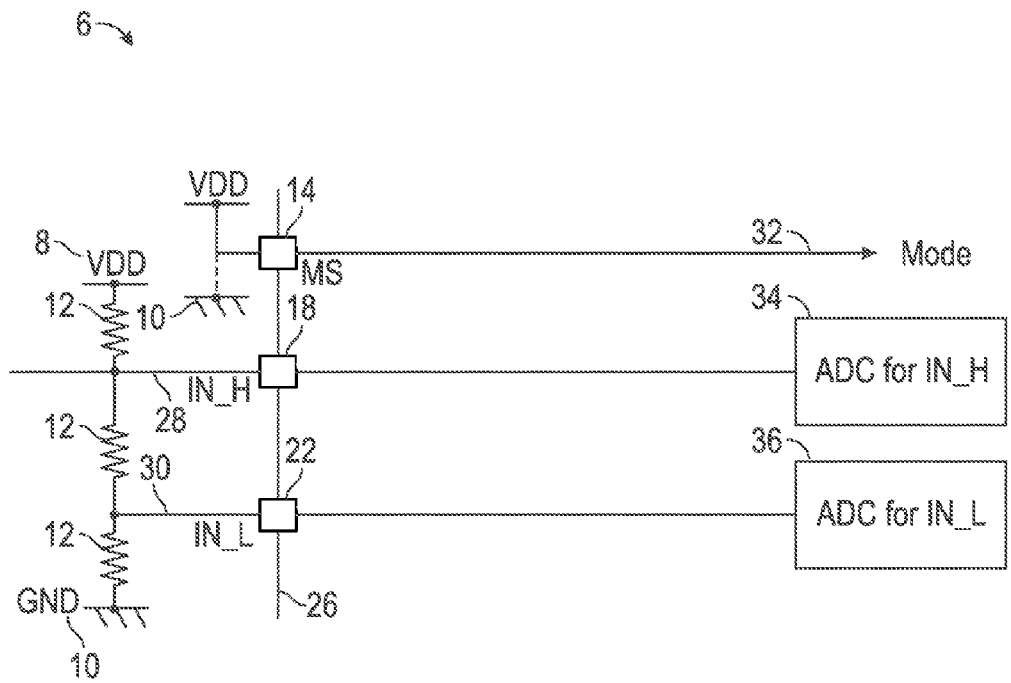
FIG. 3 is a circuit diagram illustrating portions of a conventional packaged semiconductor device.

FIG. 3 shows a circuit diagram which illustrates some elements external to and some elements internal to a conventional packaged semiconductor device (device) 6. FIG. 3 is a representative illustration of how to accomplish the above described mode setting, such as in a fan controller, using an additional mode pin or input contact. The B0 contact is not shown in FIG. 3 for simplicity. Device 6 includes a mode selector input contact (MS) 14 which in the implementation shown is a pin, a high voltage input contact (IN_H) 18 which is also a pin, and a low voltage input contact (IN_L) 22 which is also a pin. Any of the described pins could instead be non-pin contacts, as described above for other contacts, but in the implementation shown the input contacts are pins and extend outwards from a mold compound 26.

In order to set the parameters of the fan or other device, specified voltages are applied to the different pins. A supply voltage or voltage source (VDD) 8 is divided between the supply voltage 8 and a ground 10 using resistors 12 to form a high input voltage (high input voltage node) 28 and a low input voltage (low input voltage node) 30. In implementations the voltage could be either alternating current (AC) or direct current (DC), but in the examples shown it is a DC voltage. For the above fan example using four pins the IN_H pin would be the HS pin, the IN_L pin would be the LS pin, a B0 pin (not shown) would be present, and the MS pin would be used to send a mode signal 32. In the example shown in FIG. 3 the MS pin is coupled with the supply voltage VDD to set the device to a first mode in which a first mode signal is sent. If the end user instead wanted the second mode, a different voltage (or no voltage) could be applied to the MS pin to achieve the second mode signal (or no mode signal) and correspondingly the second mode.

The configuration shown in FIG. 3 requires an extra pin or input contact for the mode signal. This, of course, increases the number of pins of the device and, accordingly, its size/outline. It thus increases control for a designer/installer or end user, but at the cost of increased space/size. In the representative example shown in FIG. 3 the different voltage nodes are used as signals to set different parameters, as described above for other devices. The IN_H voltage at the high input voltage node is converted to a digital signal using an analog-to-digital converter (ADC) 34, and the IN_L voltage at the low input voltage node is also converted to a digital signal using an analog-to-digital converter (ADC) 36. In implementations the IN_H voltage may also be called the TAG_H voltage and/or the IN_H input contact may be called the TAG_H input contact. In implementations the IN_L voltage may also be called the TAG_L voltage and/or the IN_L input contact may be called the TAG_L input contact.

In the examples shown in FIGS. 1-3 there is one pin or input contact per parameter: one pin is used to set the high speed parameter, one pin is used to set the low speed parameter, one pin is used to set the B0 parameter, and if a mode selection parameter is desired then another pin is used to set the mode selection parameter.

The above fan controllers are only used as representative examples of devices which could have added control, features, functions, etc., with additional pins or input contacts, but which increased functionality also increases device/package size to add the additional pin(s) or input contact(s). Many other packaged semiconductor devices which are not fan controllers, but which are other types of devices, could also have increased functionality with more pins but, accordingly, would also have a larger device size.

Figure 4:
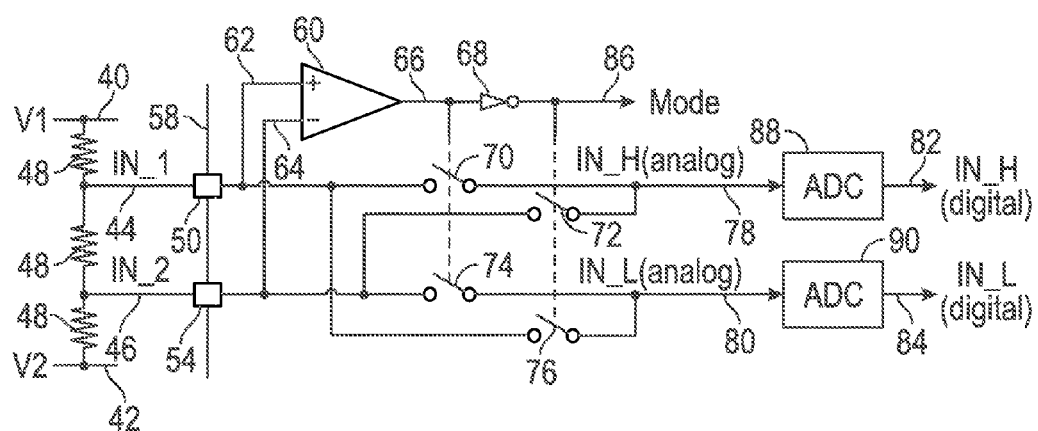
FIG. 4 is a circuit diagram illustrating portions of an implementation of a packaged semiconductor device with multi-use input contacts.

Referring now to FIG. 4 of the present application, an implementation of a packaged semiconductor device (device) 38 with multi-use input contacts is representatively illustrated. This portion of the device shows only two input contacts, but these two input contacts are used to set three parameters, as will be described. A first voltage node 40 having a voltage V1 is coupled through one or more resistors 48 with a second voltage node 42 having a voltage V2. In one implementation V1 may be a supply voltage and V2 may be a ground, and in another implementation V2 may be a supply voltage and V1 may be a ground. In other implementations neither V1 nor V2 is a ground but V1 and V2 are always different voltage levels, and the voltage may be divided between them using the resistors 48. In the implementations shown in the drawings either V1 or V2 is always a ground and the other is always a supply voltage.

A third voltage node (IN_1 node) 44 and fourth voltage node (IN_2 node) 46 are formed using the voltage dividers (resistors), such that either the IN_1 node or the IN_2 node will always have a higher voltage than the other. In the case in which V1 is a supply voltage and V2 is a ground the IN_1 node will be the high voltage signal and IN_2 will be the low voltage signal. In the case in which V2 is a supply voltage and V1 is a ground the IN_1 node will be the low voltage signal and IN_2 will be the high voltage signal.

The third voltage node is coupled with a first input contact (IN_1) 50, which in the implementation shown is a pin, and the fourth voltage node is coupled with a second input contact (IN_2) 54 which is also a pin. In other implementations non-pin contacts may be used, such as any of the other contact types described above. In the implementation shown the input contacts are pins which extend outward from a mold compound 58 of the packaged semiconductor device.

The end user thus determines, at his/her end, whether to apply the supply voltage at the V1 terminal or at the V2 terminal, and correspondingly whether to couple the V2 terminal or the V1 terminal, respectively, to ground (or to a lower voltage than the supply voltage). One or more comparing elements compare the voltages applied to the input contacts to determine which is higher and one or more setting elements are used to, in response to the comparison, couple the higher voltage signal with a high input voltage (IN_H) 78 line (high input voltage node) and to couple the lower voltage signal with a low input voltage (IN_L) 80 line (low input voltage node).

One representative way of implementing the comparing element(s) and setting element(s) is illustrated in FIG. 4. The comparing element includes a comparator 60 having a first input 62 coupled with the IN_1 voltage and a second input 64 coupled with the IN_2 voltage. The comparator may, by non-limiting example, output a first signal (such as a 1 logic signal) if the IN_1 voltage is higher, and may switch to outputting a second signal (such as a 0 logic signal) if the IN_2 voltage is higher (though these could be reversed and still achieve the proper function by altering other elements of the device). The output 66 of the comparator is then coupled with setting elements which include an inverter 68 and a plurality of switches 70, 72, 74, and 76.

While in this example the comparing element(s) and setting element(s) are different elements, in other implementations some of these functions could be performed by the same element. For example, in some cases the output of the comparator could directly be the mode signal (and thus the comparator would be one of the setting elements, setting the mode parameter) while the output of the comparator could also be routed through an inverter apart from the mode signal line to perform switching operations using the switches 70-76. Other configurations, in which the comparing functions and or setting functions are performed by more or fewer or the same elements, are possible.

The output signal from the comparator passes through the inverter, which in the implementation is a NOT gate, and the output signal from the NOT gate is a mode signal 86 used to set the mode. Expanding upon the representative examples of motor drivers described above, this mode signal could be used to switch between one or more modes such as a fan stop mode and a no fan stop mode. A pair of switches coupled on either side of the inverter are used to couple the high voltage signal with the high voltage line/node and to couple the low voltage signal with the low voltage line/node. Thus, if IN_1 is the higher voltage node, the comparator outputs a 1 to close the first switch 70 and third switch 74 (the switches 70 and 74 forming a first pair of switches) and the inverted 0 signal output from the inverter opens the second switch 72 and fourth switch 76 (the switches 72 and 76 forming a second pair of switches) so that the IN_1 signal is coupled with the high input voltage IN_H line and the IN_2 signal is coupled with the low input voltage IN_L line. Alternatively, if IN_2 is the higher voltage node, the comparator outputs a zero to open switches 70 and 74 and the inverted signal of 1 output from the inverter closes switches 72 and 76 so that the IN_1 signal is coupled with the IN_L line and the IN_2 signal is coupled with the IN_H line.

The voltages V1 and V2, and the voltage signals at IN_1 and IN2, could be AC or DC voltage signals, though in the representative examples they are DC voltage signals. The resulting high input voltage (IN_H) (high input voltage node) 78 and low input voltage (IN_L) (low input voltage node) 80 signals are accordingly analog signals in the example shown in FIG. 4 and are converted to a high input digital signal 82 (IN_H digital) and low input digital signal 84 (IN_L digital), respectively, using an analog-to-digital converter (ADC) 88 and an analog-to-digital converter (ADC) 90, respectively.

Using the packaged semiconductor device 38 as described above an end user may determine which mode to use by determining which voltage, V1 or V2, is the higher voltage. If the user desires a first mode (or a fan stop ON mode), then the user can ensure that the V1 voltage is higher than V2 (V2 can then be ground, if desired). This will cause the IN_1 voltage to be higher than the IN_2 voltage, with the result that the output signal of the comparator is 1, so that the mode signal from the inverter is 0. In this first mode, when the PWM input drops below the B0 or low duty value, the fan will stop.

If the user desires a second mode (or a fan stop OFF mode), then the user can ensure that the V2 voltage is higher than V1 (V1 can then be ground, if desired). This will cause the IN_2 voltage to be higher than the IN_1 voltage, with the result that the output signal of the comparator is 0, so that the mode signal from the inverter is 1. In this second mode, when the PWM input drops below the B0 or low duty value, the fan will not stop but will maintain the low speed LS.

In both of the above scenarios (first mode and second mode) the IN_H signal exits ADC 88 and the IN_L signal exits ADC 90 due to the control of the switches using the comparator output and inverter output, as previously described. In the first mode (fan stop ON) the IN_1 signal is the high voltage signal and so is routed to the IN_H line and the IN_2 signal is the low voltage signal and so is routed to the IN_L line. In the second mode (fan stop OFF) the IN_1 signal is the low voltage signal and so is routed to the IN_L line and the IN_2 signal is the high voltage signal and so is routed to the IN_H line.

Accordingly, the packaged semiconductor device 38 does not need to be modified at the manufacturer end to create two or more different models, and instead the mode can be selected at the customer end based on which mode the customer desires. If the customer desires the device to run in the first mode the user can set up the voltages V1 and V2 so that V1 is greater than V2, and if the customer desires the device to run in the second mode the user can set up the voltages so that V2 is greater than V1.

The representative examples of a motor drivers/controllers or fan controllers are only representative examples, and any packaged semiconductor device could be created which, using this setup/technique, allows the setting of three parameters using only two input contacts. Accordingly, using the representative example of a motor driver, a minimum PWM output (low speed) clamp mode and stop mode (0 RPM or rotational stop), and a maximum PWM output (high speed) can all be supported using only two input contacts/pins. This is distinct from the example of FIG. 3 in which each input contact is used to set one parameter (the MS contact is used to set the mode parameter, the IN_H contact is used to set the high speed voltage, and the IN_L contact is used to set the low speed voltage).

Thus in conventional devices two pins/contacts are used if two parameters are desired, three pins/contacts are used if three parameters are desired, four pins are used if four parameters are desired, and so forth. Using the methods just described one can increase the functionality of a device (i.e., increase the number of parameters that can be set) without increasing the number of input contacts. One can also, using the methods described, decrease the number of input contacts of a device without decreasing the functionality of the device (i.e., without decreasing the number of parameters that can be set).

The input contacts 50, 54 are multi-use input contacts because each can correspond with either the high voltage signal or the low voltage signal and because together they are used to determine a third signal—the mode signal. Other devices disclosed herein have input contacts that may be described as multi-use input contacts for similar reasons.

The use of two input contacts to set three parameters, as described above, is possible not only for motor or fan drivers, but for any packaged semiconductor device in which two setting items will always be in a fixed relationship relative to one another with one greater than the other. For example, in the example described just above, the IN_H voltage used to set the high fan speed will always be higher than the IN_L voltage used to set the low fan speed. In any other packaged semiconductor device in which two input contacts will be used to provide two inputs, one of which will always be greater than the other, an additional bit (with two values, 0 and 1 as described above) may be set from outside the package without increasing the number of input contacts by using the configuration described above and altering which input contact the high signal is applied to and which input contact the low signal is applied to.

The mode signal described above is used as an ON/OFF for the fan stop function, but in other devices the mode signal could be used to operate a switch that controls some other element and/or that is not an ON/OFF switch. It could vary a strength or intensity or otherwise change a level of some setting/signal, or otherwise change some operational mode, for instance, different than what is described above.

Any of the packaged semiconductor devices described herein may be configured as motor drivers, fan controllers, or other power controlling devices, and in such implementations an additional input contact configured to be coupled with a power supply and an output contact configured to output an output voltage may be included. For fan controllers the output voltage may power a fan. The high input voltage (IN_H) may set a high value for the output voltage corresponding with a high fan speed, and the low input voltage (IN_L) may set a low value for the output voltage corresponding with a low fan speed—with the mode signal determining whether the fan stops in response to the output voltage dropping below the low value. For devices other than fan controllers the high input voltage may set a high value for the power output and the low input voltage may set a low value for the output voltage, with the mode determining some non-fan related state or setting. Naturally, other parameters may be determined/set in other devices using the various input voltages and input contacts.

FIGS. 9 and 10 highlight some of the differences between the operation of the packaged semiconductor device 6 of FIG. 3 and the packaged semiconductor device 38 of FIG. 4. In FIG. 9 a method of use (method of setting parameters) 254 of device 6 is representatively illustrated using a flowchart. The method includes reading the low input (IN_L) (step 256), reading the high input (IN_H) (step 258), and reading the mode input (step 260). This method thus includes reading three inputs from three input contacts, which do not necessarily need to be performed in the order in which they are drawn.

In FIG. 10 a method of use (method of setting parameters) 262 of device 38 is representatively illustrated using a flowchart. The method includes reading a first input (IN_1) (step 264) and reading a second input (IN_2) (step 266). After this a comparison of the first input with the second input is performed (step 268). If the first input IN_1 is greater than the second input IN_2 (represented by the >=symbol), then the mode is set to ON (step 270), the second input IN_2 is selected as the low input IN_L (step 272), and the first input IN_1 is selected as the high input IN_H (step 274) (in any order or simultaneously).

If the second input IN_2 is greater than the first input IN_1 (represented by the <symbol), then the mode is set to OFF (step 276), the first input IN_1 is selected as the low input IN_L (step 278), and the second input IN_2 is selected as the high input IN_H (step 280) (in any order or simultaneously).

The comparator previously described performs the comparison of input signals, while the above-described setting elements (comparator/inverter and switches) set the mode signal and set and the input signals as high, medium or low. In FIG. 10 steps 270, 272 and 274 are shown as being performed if the first input IN_1 is greater than "or equal" to the second input IN_2. The methods described herein, however, are used only in cases in which IN_1 and IN_2 are not equal. Accordingly, it does not matter whether the comparing element (such as a comparator) uses "greater than or equal" versus "less than" logic or "greater than" versus "less than or equal" logic. The "equal" state, if the comparing element takes it into account, could be used on either flowchart line (270/272/274 or 276/278/280) and in each case accomplish the same desired function described herein. The same goes for all other comparing elements described herein.

Figure 5:
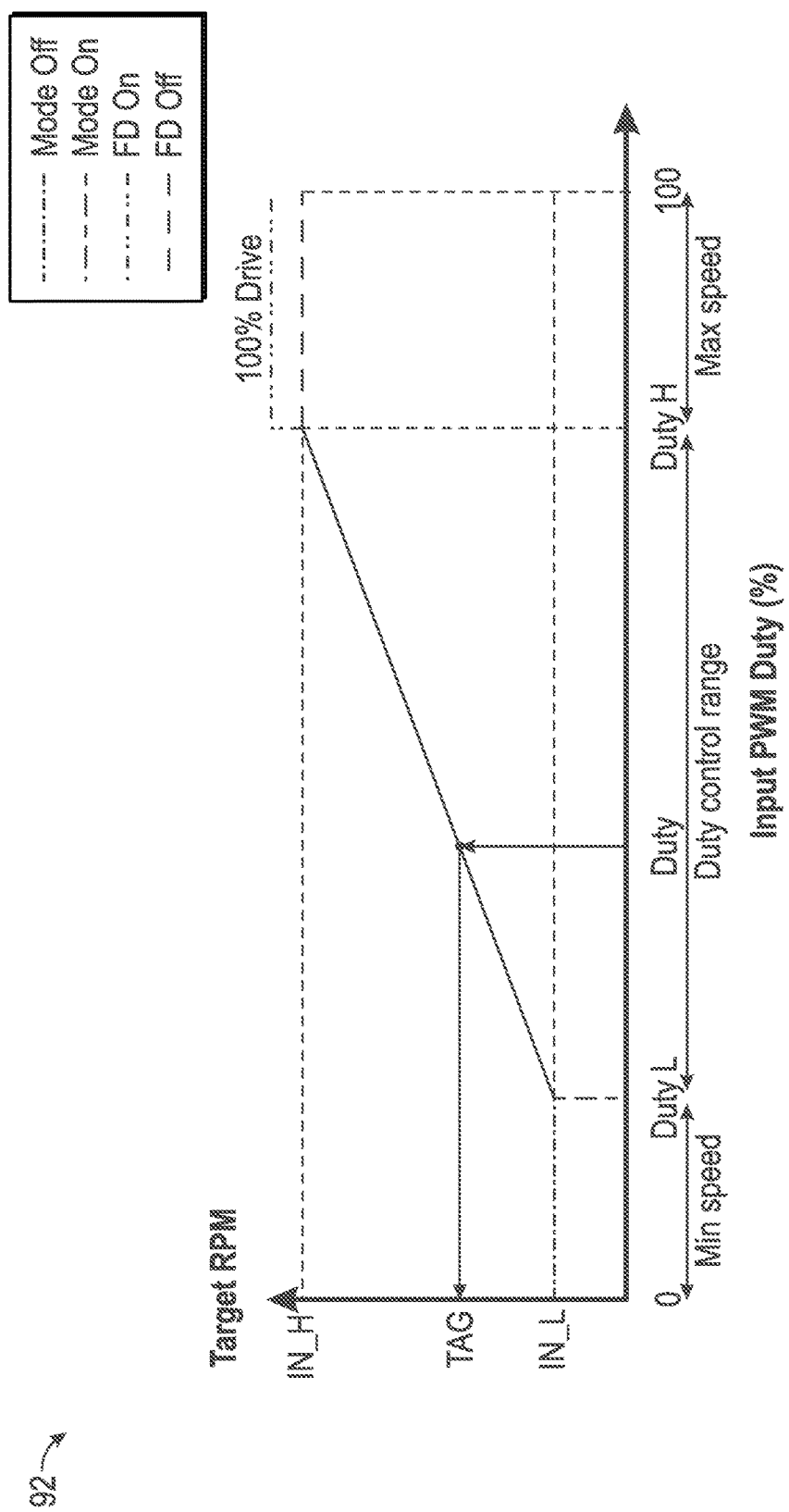
FIG. 5 is a graph illustrating behavior of the device of FIG. 4.

FIG. 5 shows a graph 92 representing the behavior of device 38 described above. The x-axis of the graph is seen to represent input PWM duty percentage while the y-axis is seen to represent the target RPM for various input (TAG) values. The IN_H (high input voltage) (which could also be called TAG_H) is seen to correspond with the top of the sloped portion of the graph while the IN_L (low input voltage) (which could also be called TAG_L) is seen to correspond with the bottom of the sloped portion. The duty may be controlled between a minimum speed value (Duty L) and a maximum speed value (Duty H). The Duty L value may be determined by a Duty L input contact (similar to that described above for the B0 pin) and the Duty H value may also be determined by a Duty H input contact, each of which may receive voltage signals, similar to the other input contacts described herein.

Below the Duty L value it can be seen that there are two possibilities. When the Fan Stop Mode is Off, represented by the horizontal line proximate IN_L, the fan does not stop when the input PWM duty percentage drops below the Duty L value, but remains at the low fan speed. When the Fan Stop Mode is ON, represented by the vertical line at Duty L, the fan stops when the input PWM duty percentage drops below the Duty L value.

Above the Duty H value it can be seen that there are also two possibilities. Because the Duty H value is always greater than the Duty L value, the same mechanism described above for using two input contacts for the IN_H/IN_L signals to get a third signal (Fan Stop) (based on which input contact has the higher voltage) can be used to get another signal from the Duty L/Duty H signals. There can be a first duty signal input contact and a second duty signal input contact. If the user couples the higher duty (Duty H) signal to the first duty signal input contact then additional comparing and setting elements (similar to those described above) could determine that Full Drive (FD) is ON. If, instead, the user couples the lower duty (Duty L) signal to the first duty signal input contact then the Full Drive (FD) would be set to OFF. When the Full Drive (FD) is Off, the fan speed stays at the high speed (which is below 100% drive) when the input PWM drive percentage rises above Duty H. When the Full Drive (FD) is On, the fan speed rises above the high speed to the 100% drive level when the input PWM drive percentage rises above Duty H. The high speed level (FD Off) could be, by example 90% of the full drive, though it could also be some other level in other implementations.

Thus, FIG. 5 representatively illustrates behavior of a motor driver whose rotation speed is controlled by a PWM duty ratio/signal, where the duty ratio range is separated into a minimum speed range, a maximum speed range, and a duty controlled linear range. Since the Fan Stop and Full Drive are set independently, all combinations of ON/OFF are available (Fan stop ON and FD ON; Fan stop ON and FD OFF; Fan stop OFF and FD ON; Fan stop OFF and FD OFF). This same method/mechanism may also be applied to any other ON/OFF or two-level/two-step parameter to obtain a third signal, such as strong/weak for loop gain, long/short for soft start time, ON/OFF of a soft switch function, large/small for lead angle (advance amount), and so forth. Each of these may allow for one extra bit without increasing the number of input contacts (or, alternatively, the same amount of bits as already used for setting of a device may remain the same while reducing the number of pins/input contacts using the same or similar techniques).

Figure 6:
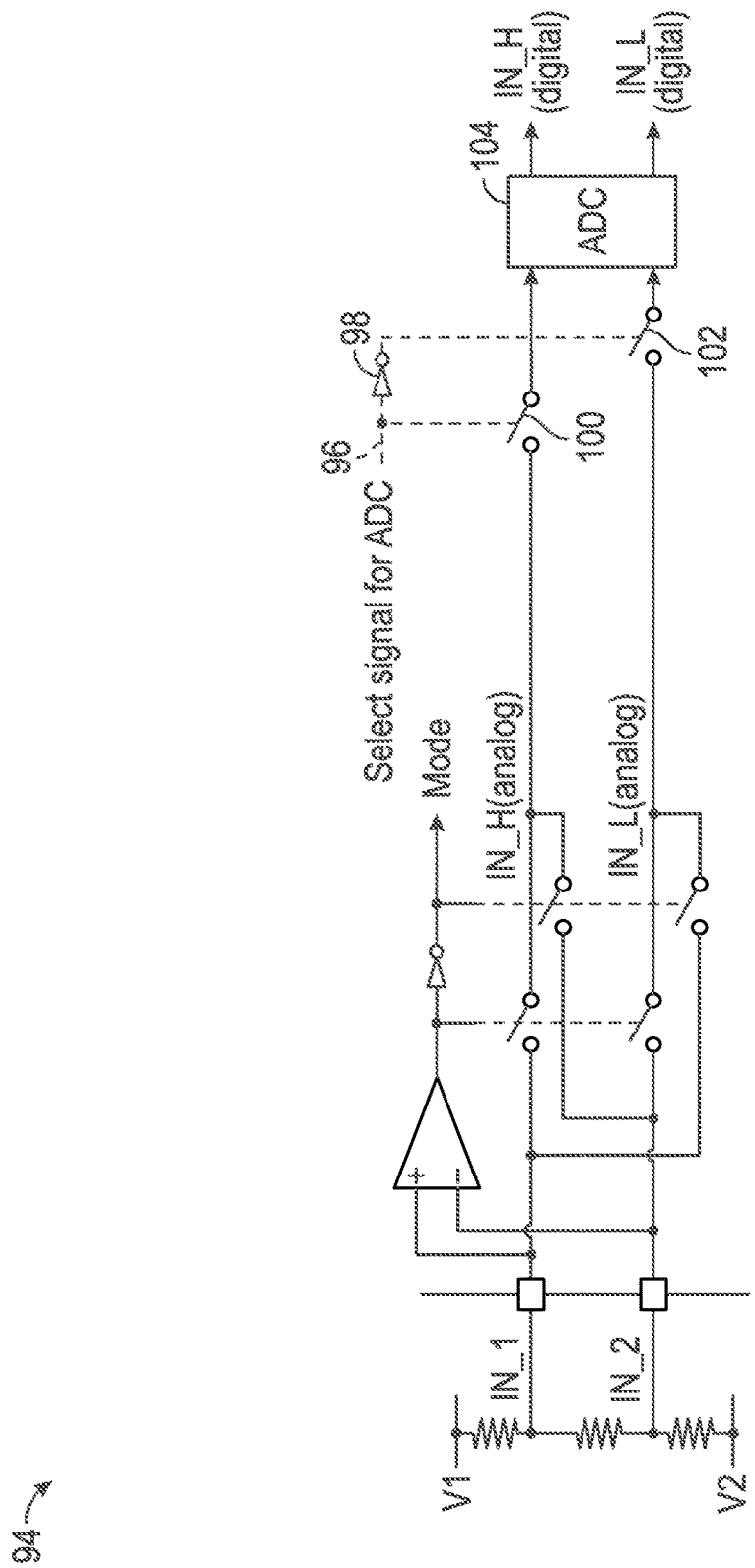
FIG. 6 is a circuit diagram illustrating portions of another implementation of a packaged semiconductor device with multi-use input contacts.

FIG. 6 representatively illustrates a packaged semiconductor device (device) 94 similar to device 38 except that instead of two analog-to-digital converters there is only a single analog-to-digital converter (ADC) 104. A fifth switch 100 selectively couples/decouples the IN_H analog line/signal with the ADC and a sixth switch 102 selectively couples/decouples the IN_L analog line/signal with the ADC. A select signal 96 is coupled with the fifth switch to open/close it and this signal is inverted through an inverter 98 (which in the implementation shown is a NOT gate) to close/open the sixth switch, respectively, so that the ADC only receives one signal at a time. The select signal could be altered using a clock signal/element or in some other manner. In this way a single ADC may be shared by both the high voltage signal and the low voltage signal and the ADC input may be selected using the select signal so that the ADC outputs both the IN_H digital signal and the IN_L digital signal.

Figure 11:
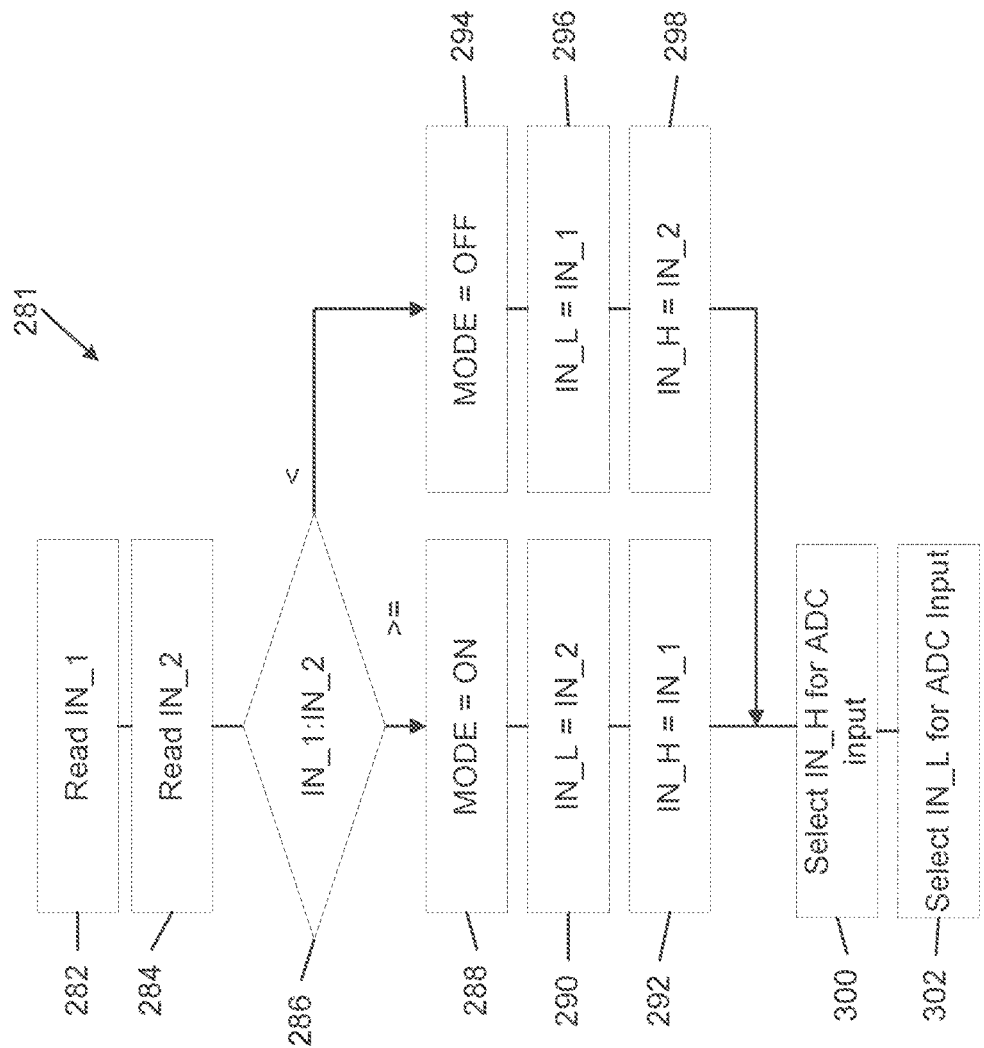
FIG. 11 is a flowchart representatively illustrating a method of use of the device of FIG. 6.

FIG. 11 shows a method of use (method of setting parameters) 281 of device 94. The first input (IN_1) is read (step 282), the second input (IN_2) is read (step 284), and IN_1 and IN_2 are compared (step 286) (all of these done by the one or more comparing elements). If IN_1 is greater than IN_2 then the mode is set to ON (step 288), IN_2 is selected as the low input voltage (IN_L) (step 290), and IN_1 is selected as the high input voltage (IN_H) (step 292) (in any order or simultaneously) using the one or more setting elements. If IN_2 is greater than IN_1, then the mode is set to OFF (step 294), IN_1 is selected as IN_L (step 296), and IN_2 is selected as IN_H (step 298) (in any order or simultaneously) using the one or more setting elements. As described with the above examples, at the comparison step the equals (=) logic may be included on either flowchart line without affecting the function because one value (IN_1 or IN_2) will always be greater than the other. IN_H analog is selected for the ADC input (step 300) and IN_L analog is selected for the ADC input (step 302) (in any order). The ADC will output IN_H digital and IN_L digital signals, as described above, though these are not shown in the flowchart of FIG. 11.

There may be variations on the above method. For example, referring to FIG. 6, before any select signal is sent one of switches 100/102 may already be closed, so that by virtue of coupling voltages to V1 and V2 either the IN_H analog or IN_L analog signal is sent to the ADC for conversion, and then only one select signal may need to be sent to switch the configuration so that the other switch is instead opened to send the other analog signal to the ADC for conversion. Another variation could be utilized in which IN_1 and IN_2 are first alternatively selected for input to the ADC and then are later compared (using the output digital values) to determine which will be IN_H and which will be IN_L, and one or more devices having such a configuration are described further below.

Figure 7:
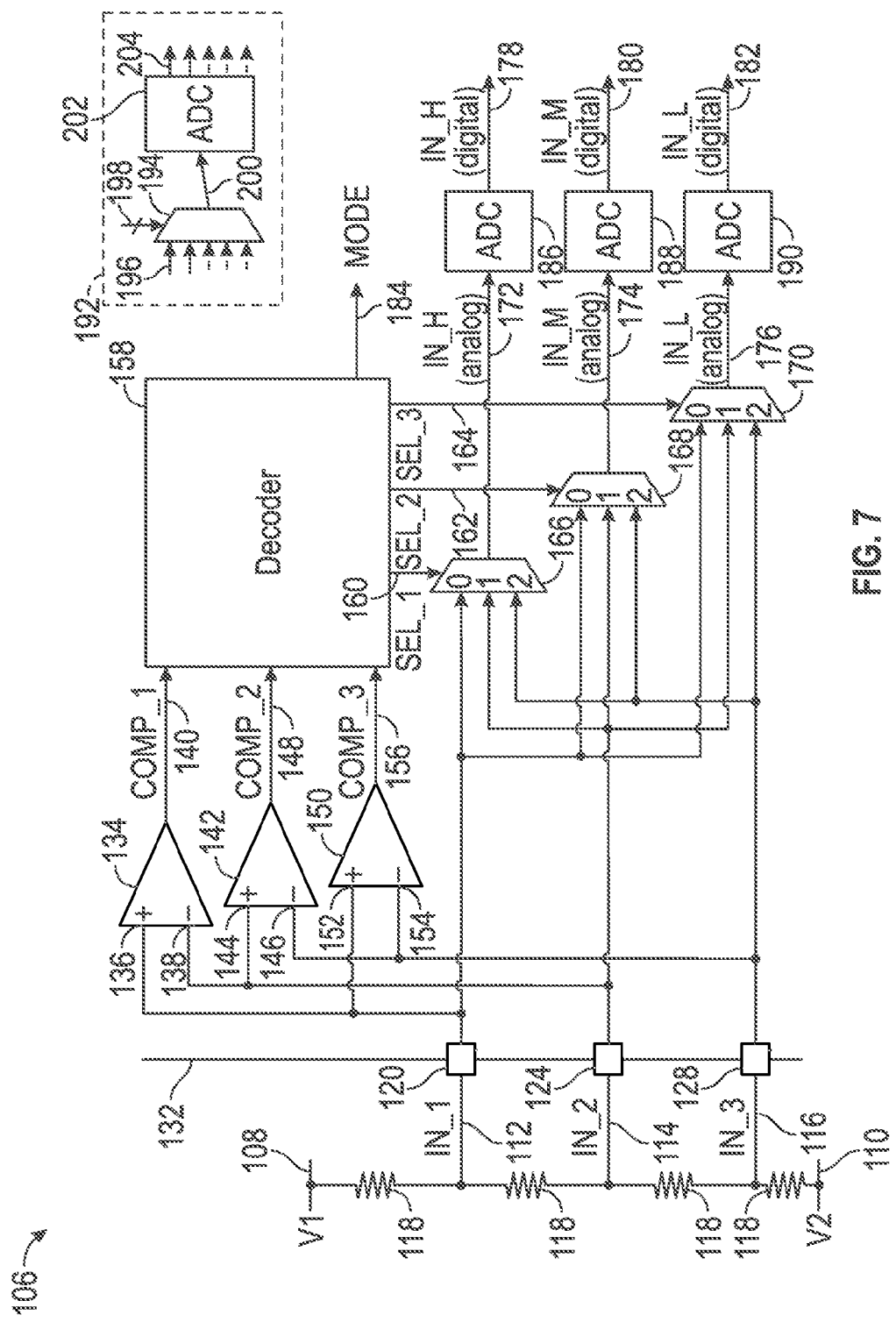
FIG. 7 is a circuit diagram illustrating portions of another implementation of a packaged semiconductor device with multi-use input contacts.

More than one input signal can be compared in order to achieve additional input bits. By non-limiting example, FIG. 7 shows a representative example of a packaged semiconductor device (device) 106 which includes three input nodes, each of which is compared to the other, in order to achieve three additional input bits. In the above examples, for instance, two input signals IN_1 and IN_2 are compared to achieve one additional input bit having two values—MODE ON and MODE OFF. With three input contacts there are three comparisons to make: the first input contact can be compared with the second input contact; the second input contact can be compared with the third input contact; and the first input contact can be compared with the third input contact. Naturally, in implementations this type of a system or device will result in three additional bits only if there is a fixed relationship between the inputs such that there is always a high input (IN_H), always a low input (IN_L), and always some input between these (a medium input IN_M), such that IN_H>IN_M>IN_L is always true.

FIG. 7 shows that a first voltage node (V1) 108 and a second voltage node (V2) 110 are coupled together and divided using voltage dividers between a first input contact (IN_1) 120 (which is a pin), a second input contact (IN_2) 124 (which is also a pin) and a third input contact (IN_3) 128 (which is also a pin). The input contacts could alternatively be anything other than pins, such as any of the other types of contacts described herein, though in the implementation shown they are pins extending through a mold compound 132. The voltage dividers are resistors 118 and are used to form a third voltage node (IN_1 node) 112, a fourth voltage node (IN_2 node) 114, and a fifth voltage node (IN_3 node) 116. The higher voltage (supply voltage) may be applied to either the V1 or V2 node, and the lower voltage (ground or a voltage lower than the supply voltage) may be applied to the other, similar to that described above for other implementations.

In the configuration shown in FIG. 7, such a coupling of supply voltage and lower voltage or ground would always result in either IN_1>IN_2>IN_3 or IN_3>IN_2>IN_1 because of the placement of the resistors, thus resulting in only one additional bit. However, resistors may be placed on one or more of the horizontal input lines (IN_1, IN_2 and/or IN_3) so as to only affect that individual line, such that the input voltage nodes can be tailored, using the V1 and V2 voltages and the resistors, to also accomplish the scenarios where IN_1>IN_3_IN_2; IN_2>IN_1>IN_3; IN_2>IN_3>IN_1, and; IN_3>IN_1>IN_2, for two additional bits (thus three bits total—each 1 or 0—and six corresponding mode values, respectively).

One or more comparing elements compare the input signals, and in the implementation shown in FIG. 7 the comparing elements include a first comparator 134 having a first input 136 coupled with the IN_1 line and a second input 138 coupled with the IN_2 line. A second comparator 142 has a first input 144 coupled with the IN_2 line and a second input 146 coupled with the IN_3 line. A third comparator 150 has a first input 152 coupled with the IN_1 line and a second input 154 coupled with the IN_3 line.

The first comparator outputs an output signal (COMP_1) 140 to a decoder 158. The second comparator outputs an output signal (COMP_2) 148 to the decoder, and the third comparator outputs an output signal (COMP_3) 156 to the decoder. In the implementation shown each comparator output signal is a logical 1 if the top input of the comparator is higher than the lower input, and a logical 0 if the opposite is true, though in other implementations this could be reversed and the decoder altered accordingly.

Each input line IN_1, IN_2 and IN_3 is coupled with a first multiplexer 166, a second multiplexer 168, and a third multiplexer 170. The multiplexers are controlled with select signals from the decoder to select one of the third through fifth voltage nodes (input signals) as a high input voltage (IN_H) (high input voltage node) 172, one as a medium input voltage (IN_M) (medium input voltage node) 174, and one as a low input voltage (IN_L) (low input voltage node) 176. The multiplexers are thus used as the one or more setting elements instead of the switches and inverters (NOT gates) described with the above implementations. The configuration is such that the first input signal IN_1 is coupled with the 0 input of each multiplexer, the second input signal IN_2 is coupled with the 1 input of each multiplexer, and the third input signal IN_3 is coupled with the 2 input of each multiplexer (though other configurations are possible).

The decoder receives the COMP_1, COMP_2 and COMP_3 signals and outputs a first selector signal (SEL_1) 160 to determine the output of the first multiplexer, a second selector signal (SEL_2) 162 to determine the output of the second multiplexer, and a third selector signal (SEL_3) 164 to determine the output of the third multiplexer, as well as a mode signal 184, according to the decoder table shown below in TABLE 1.

TABLE 1

Decoder Table

| Input | | | Output | | | |
|---|---|---|---|---|---|---|
| COMP_1 | COMP_2 | COMP_3 | SEL_1 | SEL_2 | SEL_3 | MODE |
| 1 | 1 | X | 0 | 1 | 2 | 0 |
| 1 | 0 | 1 | 0 | 2 | 1 | 1 |
| 0 | 1 | 1 | 1 | 0 | 2 | 2 |
| 0 | 1 | 0 | 1 | 2 | 0 | 3 |
| 1 | 0 | 0 | 2 | 0 | 1 | 4 |
| 0 | 0 | X | 2 | 1 | 0 | 5 |

As the decoder table shows, when COMP_1 is 1 and COMP_2 is 1, the decoder does not need the COMP_3 value (thus an X is placed there) because the COMP_1 signal means that IN_1 is greater than IN_2 and the COMP_2 signal means that IN_2 is greater than IN_3, so the first two signals will be enough to decode that IN_1>IN_2>IN_3. Thus the selector signals are output as 0 for SEL_1 so that the IN_1 signal is selected as the high input voltage IN_H, 1 for SEL_2 so that the IN_2 signal is selected as the medium input voltage, and 2 for SEL_3 so that the IN_3 signal is selected as the low input voltage. There is a similar X in the last row of Table 1 for when COMP_1 is 0 and COMP_2 is zero, because in that case it is already known that IN_2 is greater than IN_1 and that IN_3 is greater than IN_2, so that the first two signals are enough to decode that IN_3>IN_2>IN_1.

In the first row scenario of Table 1, described above, the IN_1 signal is thus selected as the IN_H signal, it being the highest voltage signal, the IN_2 signal being the medium voltage signal is selected as the IN_M signal, and the IN_3 signal being the lowest voltage signal is selected as the IN_L signal. The decoder also outputs a mode signal 184. The Decoder Table shown above reveals that there are six mode signals: 0, 1, 2, 3, 4, and 5. These can be used, for example, to control six different levels or modes of one parameter, or three modes each of two parameters, or two modes each of three parameters, etc. Thus, the six mode signals could be used to turn three parameters ON/OFF, or to adjust two parameters between a high/medium/low level each, or to adjust one parameter between four levels and another between two (ON/OFF or two different levels), or to adjust one parameter between six levels, and so forth.

The rest of the rows of Table 1 show that the comparators and decoder work together to ensure that the highest input voltage node/signal is always routed to the higher voltage line (IN_H), the medium input voltage node/signal is always routed to the medium voltage line (IN_M), and the lowest input voltage node/signal is always routed to the low voltage line (IN_L), regardless of which of IN_1, IN_2, and/or IN_3 is the highest voltage signal, which is the medium voltage signal, and which is the lowest voltage signal.

The IN_H, IN_M and IN_L analog signals are each input into a different analog-to-digital converter (ADC) and then output as a digital signal. The IN_H analog signal is input to analog-to-digital converter (ADC) 186 and the high input digital signal (IN_H digital) 178 is output therefrom. The IN_M analog signal is input to analog-to-digital converter (ADC) 188 and the medium input digital signal (IN_M digital) 180 is output therefrom. The IN_L analog signal is input to analog-to-digital converter (ADC) 190 and the low input digital signal (IN_L digital) 182 is output therefrom. The digital signals IN_H, IN_M and IN_L may then be used to set parameters for a packaged semiconductor device, either parameters similar to those described elsewhere herein or other parameters. The digital signals may be used, as has been described, to set parameters for one or more external electric devices or components coupled with the packaged semiconductor device, such as a motor, a fan, a cooling element, a mechanical device, and any of a myriad of other external electric devices or components.

An alternative configuration 192 is shown in FIG. 7, in which a multiplexer 194 receives several input signals 196, each input signal being one of the analog input signals IN_H analog, IN_M analog, and IN_L analog. Five input signals are shown in the drawing and this is only intended to represent that the device shown in FIG. 7 could be scaled to have any number of analog input nodes and input signals instead of only two or three as shown in the representative examples in the drawings. A select signal 198 determines which input signal is forwarded to a single analog-to-digital converter (ADC) 202. The selected signal is sent as an output signal 200 from the multiplexer to the ADC and then a digital output signal 204 is output from the ADC. There are five output signals drawn instead of three for the same reasons described above with respect to the input signals. In this way, a single ADC may be shared by the different analog input signals, somewhat similar to what was described with respect to device 94 of FIG. 6 above, except with the use of a multiplexer between the analog signals and the ADC instead of individual switches.

Figure 8:
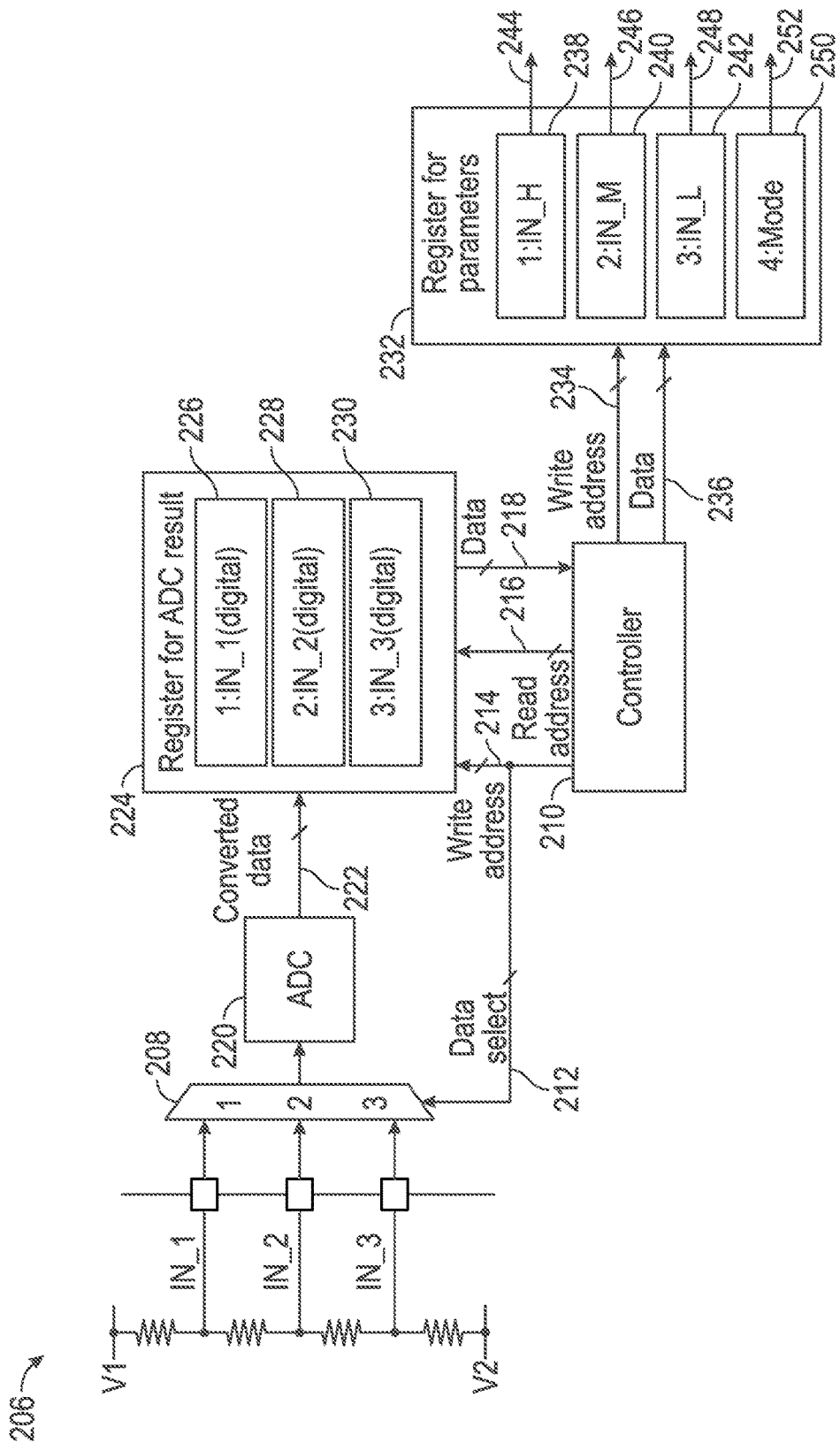
FIG. 8 is a circuit diagram illustrating portions of another implementation of a packaged semiconductor device with multi-use input contacts.

FIG. 8 shows a representative example of a packaged semiconductor device (device) 206 which has a similar setup to FIG. 7 outside the device using V1 and V2 nodes divided between three input nodes IN_1, IN_2 and IN_3 using resistors to capture six different scenarios. As described above with respect to FIG. 7, there may be resistors on the horizontal input lines IN_1, IN_2 and/or IN_3 to affect only those lines, so that the six possible scenarios are possible: IN_1>IN_2>IN_3; IN_1>IN_3>IN_2; IN_2>IN_1>IN_3; IN_2>IN_3>IN_1; IN_3>IN_2>IN_1, and; IN_3>IN_1>IN_2.

Inside the packaged device the comparing and setting elements are different than what was described above with respect to FIG. 7. The three input signals IN_1, IN_2 and IN_3 are each input to a multiplexer 208. The IN_1 signal is input to a 1 input line of the multiplexer, the IN_2 signal is input to a 2 input line of the multiplexer, and the IN_3 signal is input to a 3 input line of the multiplexer (though these could be varied). A controller 210 sends a data select signal 212 to the multiplexer to determine which input signal is forwarded to an analog-to-digital converter (ADC) 220. Converted data signals 222 are then sent to an ADC register (first register) 224 to register the digital ADC result.

The ADC stores a first value (IN_1 digital) 226 corresponding with the digital IN_1 signal, a second value (IN_2 digital) 228 corresponding with the digital IN_2 signal, and a third value (IN_3 digital) 230 corresponding with the digital IN_3 signal. In implementations these values are the digital signal values themselves (in other words the converted digital voltage signals). When the controller sends the data select signal to the multiplexer to determine which input signal will be passed to the ADC the controller correspondingly sends a write address signal 214 to the ADC register to determine the write address for each input voltage. Thus the IN_1 digital value is stored at a first address of the ADC register (labeled 1), the IN_2 digital value is stored at a second address (labeled 2) of the ADC register, and the IN_3 digital value is stored at a third address (labeled 3) of the ADC register. Other configurations are of course possible. The controller may include a clock element or the like to switch the data select and write address signals between a first, second, and third signals.

The write address signal 214 is shown in FIG. 8 to be the same signal as the data select signal 212, just split using two lines (for example sending a signal representing "2" to the multiplexer and the same signal representing "2" to the first register will pass the IN_2 signal through the multiplexer to the ADC and store the digital output of the ADC in the second address of the first register), though in other implementations the write address signal and data select signal could be individual signals sent from the controller.

In the implementation shown the actual values of the digital input signals IN_H, IN_M and IN_L are stored in the first register, though in other implementations the registers themselves may only store actual addresses for the locations of the digital input signals stored in other memory coupled to the system, such as random access memory (RAM) or some other memory element coupled with the first register and/or controller—and in such cases the ADC register registers the actual address associated with each input signal but does not store the digital signal itself—and the controller simply uses the actual addresses to locate the digital signals in associated memory for comparison and forwarding to another register and/or for setting elements as described later.

Once all the digital input signals are stored or registered in the ADC register, the controller sends a first read address signal 216 to the ADC register for the digital IN_1 signal and receives a data signal 218 including the digital value of the IN_1 signal (though as described above, in other implementations the controller could only receive the actual address of the IN_1 digital signal from the first register and then access the IN_1 digital signal from other memory using the actual address). This is repeated for the IN_2 and IN_3 digital signals. The controller then compares the three digital values of the input voltage signals to determine the high, medium, and low signal. This may be done, by non-limiting example, using bitwise comparison of the digital IN_1, IN_2 and IN_3 values. Such comparison could be done using subtraction, for instance, of the digital values. The controller, thus, in implementations is the comparing element.

Once the controller has compared the digital IN_1, IN_2 and IN_3 values to determine which is the high signal, which is the medium signal, and which is the low signal, the controller sends a write address signal 234 to a parameter register (second register) 232 for the high input voltage signal IN_H and sends a data signal 236 to the parameter register which includes the digital IN_H signal. The same is repeated for the medium input digital signal IN_M and the low input signal IN_L. For example, the controller may send a write address for the first address (labeled 1) of the second register and then send the digital high voltage signal IN_H to be stored in that address, and so forth with the other digital input signals. Additionally, the controller sends a write address for mode data and sends a data signal associated with a mode. As described above for the FIG. 7 implementation, when there are three input voltages there will be six mode values and these could be used to set one or more parameters to various levels.

The parameter register in the implementation shown thus has all of the digital signals IN_H, IN_M, IN_L, and the mode signal stored therein in addresses 1-4, respectively. Naturally, in other implementations they may be stored in other orders. In the implementation shown, however, the controller always records in the first address (labeled 1) the digital value 238 for the highest of the three input signals (IN_H), always records in the second address (labeled 2) the digital value 240 for the medium of the three input signals (IN_M), always records in the third address (labeled 3) the digital value 242 of the lowest of the three input signals (IN_L), and always records in the fourth address (labeled 4) the digital value 250 of the mode signal.

In the implementation shown in FIG. 8 the actual digital values for IN_H, IN_M, IN_L and the mode signal are stored in the second register, which is used to output the high input digital signal 244, medium input digital signal 246, low input digital signal 248, and mode signal 252 to control parameters of the packaged semiconductor device or one or more electrical devices or components coupled with the packaged semiconductor device. This could be done, by example, by having another control element which reads the data in addresses 1-4 of the second register, or the second register may itself be configured to output the signals.

In other implementations the actual digital values for IN_H, IN_M, IN_L and the mode may be stored in memory coupled with the second register and/or the controller such as random access memory (RAM) or any other memory type. In such an implementation the first address 1 of the second register may, instead of storing the actual high input digital signal, store or register at address 1 the actual address where the high input digital signal is stored in another memory element, the second address 2 of the second register may store the actual address where the medium input digital signal is stored in an associated memory element, and so forth. A second controller (or controller 210) could then read the stored addresses in the parameter register to access the high, medium, and low input voltage signals and the mode signal stored in the associated memory and send those signals to their appropriate locations/device elements to properly set the parameters.

Thus in the device 206 of FIG. 8 the comparing element is the controller and the setting elements include the controller, the ADC, the ADC register, and the parameter register. Table 2, below, shows a representative example of how the mode may be determined by the controller when making comparisons of the digital input signals.

TABLE 2

| Result of Comparison | Mode |
|---|---|
| IN_1 > IN_2 > IN_3 | 0 |
| IN_1 > IN_3 > IN_2 | 1 |
| IN_2 > IN_1 > IN_3 | 2 |
| IN_2 > IN_3 > IN_1 | 3 |
| IN_3 > IN_1 > IN_2 | 4 |
| IN_3 > IN_2 > IN_1 | 5 |

As with the other previously described examples, the device of FIG. 8 could be scaled up so that there are four input signals, or five, or six, and so forth, and with each increase there will be an increase in the modes that could be set (or the number of bits for additional parameter setting). The total number of additional bits for any given number of input contacts using the methods/mechanisms described herein may be found using the factorial n!/2, where n is the number of input contacts, so long as there is the existing relationship that the input values will always be such that they may be lined up from highest to lowest. Thus for two input contacts as described above where one input value is always greater than the other the number of additional bits using the same two contacts will be 2!/2=2/2=1 additional bit (1 or 0). For three input contacts where the three inputs will always include a high, medium and low input, as described above there will be 3!/2=6/2=3 additional bits (each 1 or 0 for six total mode signal values). For four input contacts where there is always a highest value, a second highest value, a third highest value, and a lowest value, there would be 4!/2=12 additional bits (each with 1 or 0 for 24 additional mode settings).

This math scales quickly, with five input contacts resulting in 60 additional bits, six input contacts resulting in 360 additional bits, seven input contacts resulting in 2,520 additional bits, but as described this math only holds for instances where the input values will always hold the same greatest to smallest relationship—this does not mean that the values at the input contact are always in that same relationship—but the values out of the comparing and setting elements will always be the same. For instance, in the above examples the input signals IN_1, IN_2 and IN_3 are not always in the same relationship with one another-sometimes IN_1 is greatest, sometimes IN_2 is greatest and sometimes IN_3 is greatest. At the outputs IN_H, IN_M and IN_L however, which are the signals used to set parameters, IN_H is always the greatest, IN_L is always the lowest, and IN_M is always between the others. For other examples where there are setting signals that will always hold such a relationship, even for four, five, or six or more pins, the number of additional bits that can be had without increasing the number of input contacts scales greatly. And, as described above, any two bits could be used for an ON/OFF function, any two or more (or many) bits could be used for levels of a single parameter, and so forth.

Figure 12:
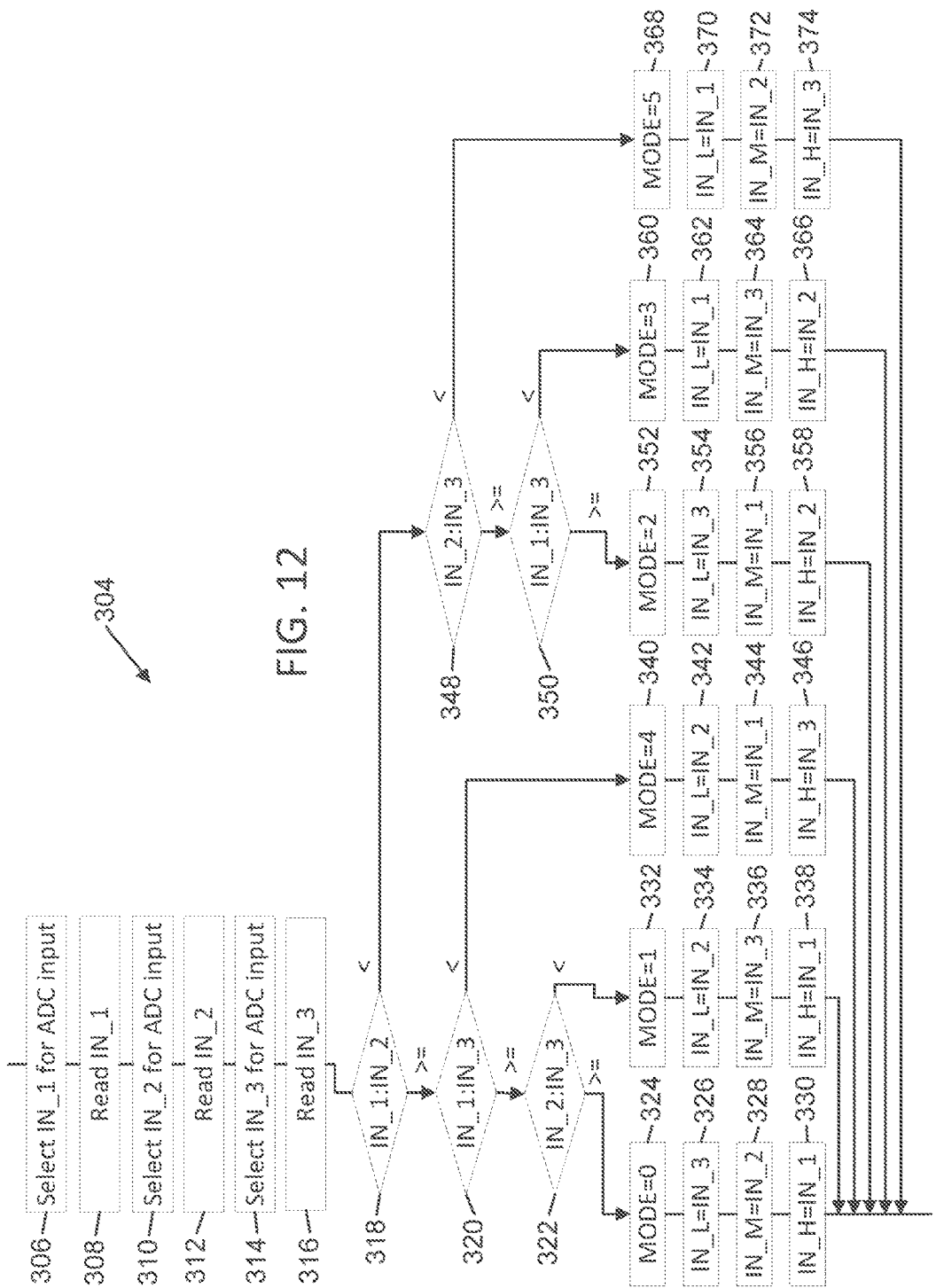
FIG. 12 is a flowchart representatively illustrating a method of use of the device of FIG. 8.

FIG. 12 shows a flowchart which representatively illustrates a method of use (method of setting parameters) 304 of device 206. The first input signal IN_1 is selected for input to the ADC (step 306) and is read (or in other words passed through the multiplexer to the ADC and stored in the ADC register) (step 308). The second input signal IN_2 is selected for the ADC (step 310) and is read (or in other words passed through the multiplexer to the ADC and stored in the ADC register) (step 312). The third input signal IN_3 is selected for input to the ADC (step 314) and is read (or in other words passed through the multiplexer to the ADC and stored in the ADC register) (step 316). As one may expect, the input signal selection and reading/storing of the ADC output values may be done in any order, so for instance the second input signal IN_2 could be selected/read first, and then the first input signal IN_1, etc., or the first input signal first and then the second input signal, etc., though with the implementation shown in FIG. 8 an input signal will be both selected (using the data select signal) and read/stored into the ADC register before another input signal is selected and read/stored into the ADC register.

Methods of use of the packaged semiconductor device may include other steps not shown in FIG. 12 but described above to some extent, such as the controller obtaining the stored digital values for the input signals either directly from the ADC register or from an associated memory element, and so forth.

FIG. 12 shows a representative order for comparing the digital signals to one another, though there are many other orders in which the comparisons could be made and the method still function for setting parameters properly. In the representative example the digital values IN_1 and IN_2 are compared (step 318). If IN_1 is larger than IN_2, then IN_1 and IN_3 are compared (step 320). If IN_1 is larger than IN_3, then IN_2 and IN_3 are compared (step 322). If IN_2 is larger than IN_3, then the mode is set to zero (0) (step 324), the third input voltage IN_3 is set as the low input voltage IN_L (step 326), the second input voltage IN_2 is set as the medium input voltage IN_M (step 328), and the first input voltage IN_1 is set as the high input voltage IN_H (step 330) (in any order or simultaneously).

Going back to step 322, if IN_3 is greater than IN_2 then the mode is set to one (1) (step 332), the second input voltage IN_2 is selected as the low input voltage IN_L (step 334), the third input voltage IN_3 is selected as the medium input voltage IN_M (step 336), and the first input voltage IN_1 is selected as the high input voltage IN_H (step 338) (in any order or simultaneously).

Going back to step 320, if IN_3 is greater than IN_1 then the mode is set to four (4) (step 340), the second input voltage IN_2 is selected as the low input voltage IN_L (step 342), the first input voltage IN_1 is selected as the medium input voltage IN_M (step 344), and the third input voltage IN_3 is selected as the high input voltage IN_H (step 346) (in any order or simultaneously).

Going back to step 318, if IN_2 is greater than IN_1 then IN_2 is compared with IN_3 (step 348). If IN_2 is greater than IN_3, then IN_1 is compared with IN_3 (step 350). If IN_1 is greater than IN_3 then the mode is set to two (2) (step 352), the third input voltage IN_3 is selected as the low input voltage IN_L (step 354), the first input voltage IN_1 is selected as the medium input voltage IN_M (step 356), and the second input voltage IN_2 is selected as the high input voltage IN_H (step 358) (in any order or simultaneously).

Going back to step 350, if IN_3 is greater than IN_1 then the mode is set to three (3) (step 360), the first input voltage IN_1 is selected as the low input voltage IN_L (step 362), the third input voltage IN_3 is selected as the medium input voltage IN_M (step 364), and the second input voltage IN_2 is selected as the high input voltage IN_H (step 366) (in any order or simultaneously).

Going back to step 348, if IN_3 is greater than IN_2 then the mode is set to five (5) (step 368), the first input voltage IN_1 is selected as the low input voltage IN_L (step 370), the second input voltage IN_2 is selected as the medium input voltage IN_M (step 372), and the third input voltage IN_3 is selected as the high input voltage IN_H (step 374) (in any order simultaneously).

As with other comparison steps described above, the "equals" ("or equal to") logic may apply to either line at any step since none of the values (IN_1, IN_2, IN_3) will be equal in the methods described herein.

Other steps, described above, but not included in FIG. 12, may also be performed in methods of use of semiconductor package devices, such as storing values or addresses of the digital input signals in the parameter register, accessing those values or addresses to send the digital IN_H, IN_M, IN_L, and mode signals to control or set parameters of the packaged semiconductor device and/or one or more electrical devices or components coupled with the packaged semiconductor device, and so forth.

In the above method shown in FIG. 12 there are three input contacts or pins used for six states, which is a 50% reduction of the ratio of contacts/states relative to some conventional semiconductor package devices.

Figure 13:
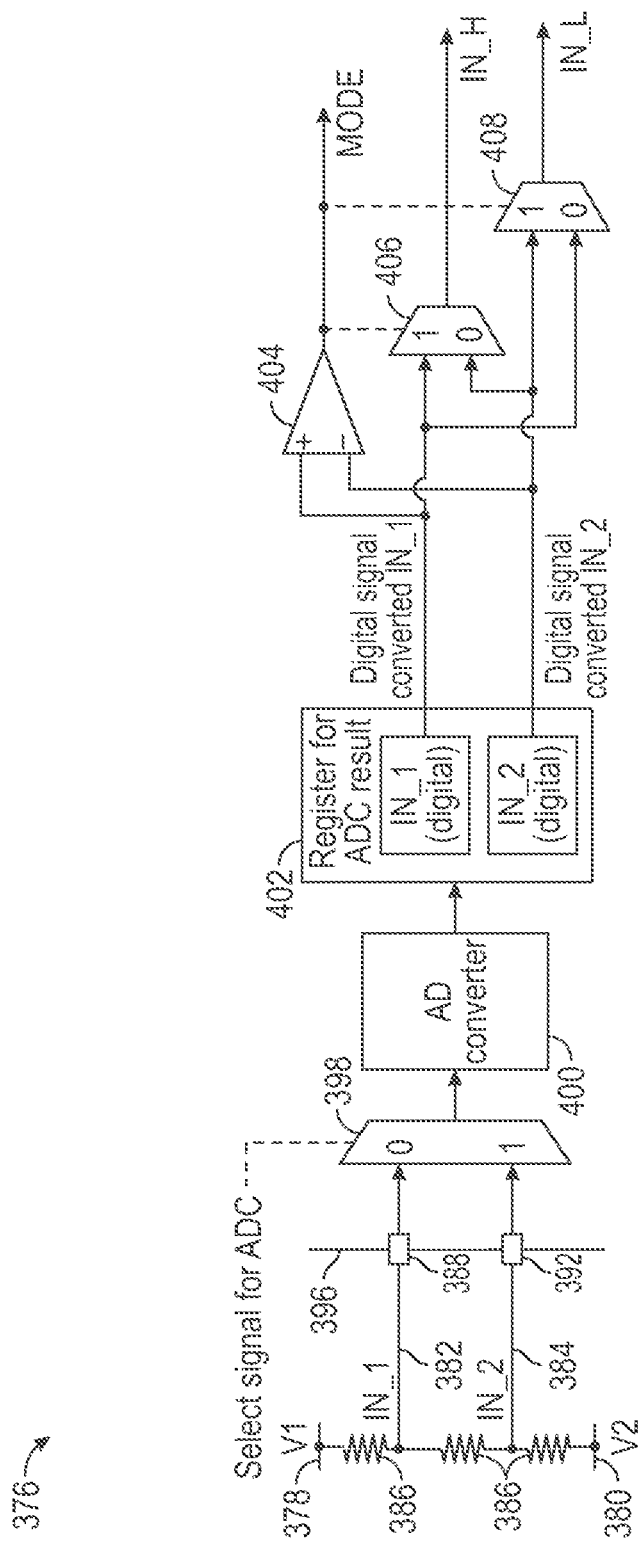
FIG. 13 is a circuit diagram illustrating portions of another implementation of a packaged semiconductor device with multi-use input contacts.

Referring now to FIG. 13, in implementations a packaged semiconductor device (device) 376 includes a first input contact (IN_1) 388 and a second input contact (IN_2) 392. In implementations these could be any of the contact types described herein, but in the implementation shown they are pins extending outward from a mold compound 396. A user may apply different voltages to the input contacts similarly as described above for other devices. Using elements external to the package, a user may form a first voltage (V1) to a first voltage node 378 and a second voltage (V2) to a second voltage node 380. Either of these may be the higher voltage, and the lower voltage may or may not be ground.

The voltage difference between V1 and V2 is divided using resistors 386 so that a third voltage node (IN_1 node) 382 and a fourth voltage node (IN_2 node) 384 are formed. The IN_1 and IN_2 nodes thus output a high and a low signal to a first multiplexer 398, but in some cases the IN_1 node will be the higher voltage node, and in other cases IN_2 will be the higher voltage node. As described above with respect to other examples, this will allow the setting of three parameters using only the two input contacts, because the higher voltage node may be coupled with a high voltage line to set a high voltage or other parameter, the low input voltage may be coupled with a low voltage line to set a low voltage or other parameter, and a mode signal may be selected depending in which node, IN_1 or IN_2, is the higher voltage node.

The first multiplexer is controlled using a select signal. The select signal, for example, may first select the IN_1 analog signal (i.e., it may select the 0 input) to pass through the multiplexer to the analog-to-digital converter (ADC) 400, and then the converted digital IN_1 signal may be stored in a first location of a register 402 (or a location of the digital IN_1 signal in other memory may be stored in the first location of the register). The select signal could then select the IN_2 signal to pass through the ADC and to store the converted digital IN_2 signal in a second location of the register (or a location of the digital IN_2 signal in other memory may be stored in the second location of the register). Naturally in other configurations this order could be reversed, or the couplings of the IN_1 and IN_2 lines to the 0 and 1 inputs of the multiplexer, respectively, could be switched, and so forth, and the practitioner of ordinary skill in the art will know how to make other changes as necessary to other elements or to the overall configuration so that the device functions as desired.

The register could be controlled using an additional controller, not shown in FIG. 13, or the select signal could be sent directly to the register in addition to the first multiplexer, so that for instance a 0 select signal selecting the IN_1 input to pass through the first multiplexer also selects the first slot of the register for storing the IN_1 digital signal (or its location), and so forth with the IN_2 signal. Other configurations are possible.

The digital signals IN_1 and IN_2 are output from the register or are otherwise coupled with one or more comparing elements using the stored register values. In the implementation shown the one or more comparing elements includes a comparator 404. The digital IN_1 signal is coupled with the high input of the comparator and the digital IN_2 signal is coupled with the low input of the comparator. The comparator directly outputs the mode signal, so that if the IN_1 signal is the higher signal the comparator will output a mode signal of 1, while if the IN_2 signal is higher the comparator will output a mode signal of 0. This configuration could be reversed in other implementations.

The digital signals IN_1 and IN_2 are also each coupled with a second multiplexer 406 and a third multiplexer 408. The IN_1 digital signal is coupled with the 1 input of the second multiplexer and with the 0 input of the third multiplexer. The IN_2 digital signal is coupled with the 0 input of the second multiplexer and with the 1 input of the third multiplexer. Accordingly, when the IN_1 signal is the higher signal, the comparator will output a 1, and the output signal from the comparator will control the second and third multiplexers so that each outputs the 1 input. Thus the second multiplexer will output the IN_1 signal, which is coupled with a high input (IN_H) line, while the third multiplexer will output the IN_2 signal, which is coupled with a low input (IN_L) line. The comparator and the second and third multiplexers, accordingly, are the one or more setting elements that select or set one input voltage as the high input voltage and the other input voltage as the low input voltage. In the example described above they select the IN_1 voltage as the high input voltage IN_H and the IN_2 voltage as the low input voltage IN_L.

When the IN_2 digital signal is the higher voltage signal the comparator outputs a 0 signal so that the 0 inputs of the second and third multiplexers are passed through—thus the IN_2 signal is passed through the second multiplexer and coupled with the IN_H line and the IN_1 signal is passed through the third multiplexer and coupled with the IN_L line. In this scenario the setting elements select the IN_2 signal as the high input signal IN_H and the IN_1 signal as the low input signal IN_L.

An opposite configuration as that described above, or variations of this configuration, are possible, and the representative example of FIG. 13 could also be expanded, such as by adding one or more additional comparators and/or one or more additional multiplexers, to accommodate more signals (such as a high, medium, and low signal as described above with other devices—or even more than three input signals). The practitioner of ordinary skill in the art will know how to scale this and other representative examples described herein using the principles disclosed herein, to increase the number of input signals, while still achieving the additional parameter setting functions as described herein, such as by altering/removing/adding/moving, etc., one or more switches, one or more comparators, one or more multiplexers, one or more registers, one or more analog-to-digital converters (ADCs), one or more controllers, one or more select signal generators, one or more resistors, one or more circuit lines, and so forth.

Any of the comparators described herein may be discrete components and/or may be constructed using programmed field-programmable gate arrays (FPGAs), or the like. The comparator(s) or other comparing elements may only output a value/signal when the value/signal changes.

Using the above methods and devices it is possible to add parameter settings without increasing input contact count, which allows the ability of increasing functions, performance and/or modes with no or with less additional cost than would be present with adding more input contacts but with the additional advantage of not increasing package size.

This allows the use of higher complexity packaged semiconductor devices in environments where input contacts are limited due to size constraints and/or input signal number limits. The methods and devices disclosed herein also allow a single model to replace multiple prior models by allowing the end users to configure the modes at their end, which may reduce management costs, procurement costs, administrative costs, and other costs associated with multiple models for the manufacturer and the purchaser.

The setting of modes by the end user may be done quickly and easily, as described herein, and each end user could use different modes using the same type of packaged semiconductor device model for different end uses/configurations. The use of fewer pins or input contacts may reduce chip mounting costs and/or other implementation costs, and a smaller package size may increase the ease of circuit board design.

As described above with respect to some of the prior art, added functionality can be achieved for packaged semiconductor devices by simply adding more input contacts, utilizing programmable memory elements, or by making different connections between input contacts and internal elements at the manufacturer end, though these result in increased cost and do not have some or all of the features described above for the herein disclosed semiconductor packaged devices, including reduced (or maintained) package size.

As shown herein, the comparison of input voltages/signals may be done before or after analog-to-digital conversion, thus the analog signals themselves may be compared or the converted digital signals may be compared. Each input signal may have its own analog-to-digital converter (ADC) or a shared ADC may be used, with the input signal to the ADC being switched as described herein using an inverter/switch combination or a multiplexer, or using some other configuration/method. As the number of input signals increases (such as above 2 or above 3 input signals), it may be more desirable for ease of circuit design to, in general, use multiplexers and shared ADCs (such as in FIGS. 6 and 8) instead of individual comparators and individual ADCs (such as in FIGS. 4, 6 and 7). As shown by the example of FIG. 8, comparators are not needed if the input signals are converted to digital signals before the comparison is performed.

In places where the description above refers to particular implementations of packaged semiconductor devices with multi-use input contacts and related methods and implementing components, sub-components, methods and sub-methods, it should be readily apparent that a number of modifications may be made without departing from the spirit thereof and that these implementations, implementing components, sub-components, methods and sub-methods may be applied to other packaged semiconductor devices with multi-use input contacts and related methods.

What is claimed is:

1. A packaged semiconductor device, comprising:
   a first input contact configured to receive a first input voltage;
   a second input contact configured to receive a second input voltage;
   one or more comparing elements configured to compare the first input voltage with the second input voltage, and;
   one or more setting elements configured to set one or more operating parameters of the device in response to a comparison of the first input voltage and the second input voltage by the one or more comparing elements;
   wherein, in response to the first input voltage being greater than the second input voltage, the one or more setting elements are configured to select the first input voltage as a high input voltage, select the second input voltage as a low input voltage, and set a mode signal of the device to a first value;
   wherein, in response to the second input voltage being greater than the first input voltage, the one or more setting elements are configured to select the first input voltage as the low input voltage, select the second input voltage as the high input voltage, and set the mode signal to a second value;
   wherein the first value and the second value of the mode signal are configured to alter an operating condition of an electronic component coupled with the device between a first state and a second state, respectively;
   wherein the packaged semiconductor device is configured to set the high input voltage, the low input voltage, and the mode signal using only the first input contact and the second input contact; and
   wherein the high input voltage, the low input voltage, and the mode signal are supplied to the electronic component.

2. The device of claim 1, wherein the one or more comparing elements comprises a comparator.

3. The device of claim 1, wherein the one or more setting elements comprises one or more switches and one or more inverters.

4. The device of claim 1, wherein the one or more setting elements comprises one or more multiplexers.

5. The device of claim 1, wherein the device further comprises one or more analog-to-digital converters (ADCs) to convert the high input voltage into a high input digital signal and the low input voltage into a low input digital signal.

6. The device of claim 1, wherein the first input contact and the second input contact are each coupled with a first multiplexer, the first multiplexer is coupled with an analog-to-digital converter (ADC), the ADC is coupled with a register, and the register is coupled with a comparator and with a second multiplexer and a third multiplexer, the second multiplexer and third multiplexer being controlled by an output of the comparator.

7. The device of claim 1, wherein the device comprises a fan controller comprising a third input contact, configured to be coupled with a power supply, and an output contact configured to output an output voltage to power a fan, wherein the high input voltage is configured to set a high value for the output voltage corresponding with a high fan speed, wherein the low input voltage is configured to set a low value for the output voltage corresponding with a low fan speed, and wherein the mode signal is configured to determine whether the fan stops in response to the output voltage dropping below the low value.

8. A packaged semiconductor device, comprising:
a first input contact configured to receive a first input voltage;
a second input contact configured to receive a second input voltage;
a third input contact configured to receive a third input voltage;
one or more comparing elements configured to compare the first input voltage, the second input voltage, and the third input voltage, and;
one or more setting elements configured to, in response to a comparison of the input voltages by the one or more comparing elements, select one of the input voltages as a high input voltage, select another of the input voltages as a medium input voltage, and select another of the input voltages as a low input voltage;
wherein the one or more setting elements are further configured to vary values of one or more mode signals of the device in response to which of the input voltages is selected as the high input voltage, which of the input voltages is selected as the medium input voltage, and which of the input voltages is selected as the low input voltage;
wherein the values of the one or more mode signals are configured to alter an operating condition of an electronic component coupled with the device between one or more states;
wherein the packaged semiconductor device is configured to set the high input voltage, the medium input voltage, the low input voltage, and the one or more mode signals using only the first input contact, the second input contact, and the third input contact; and
wherein the high input voltage, the medium input voltage, the low input voltage, and the one or more mode signals are supplied to the electronic component.

9. The device of claim 8, wherein the one or more mode signals comprises three mode signals, and wherein the one or more setting elements are configured to vary the three mode signals between two values each in response to which of the input voltages is selected as the high input voltage, which of the input voltages is selected as the medium input voltage, and which of the input voltages is selected as the low input voltage.

10. The device of claim 8, wherein the one or more setting elements are configured to vary one of the one or more mode signals between six values in response to which of the input voltages is selected as the high input voltage, which of the input voltages is selected as the medium input voltage, and which of the input voltages is selected as the low input voltage.

11. The device of claim 8, wherein one or more analog-to-digital converters (ADCs) are coupled between the one or more comparing elements and the input voltages, and wherein the one or more comparing elements compare digital values of the input voltages.

12. The device of claim 8, wherein the one or more comparing elements comprises three comparators, wherein each of the first input contact, the second input contact and the third input contact is coupled with inputs of two of the three comparators, wherein each input contact is further coupled with inputs of three multiplexers, wherein a decoder is configured to control the three multiplexers in response to receiving outputs of the three comparators, and wherein the input voltages are coupled with one or more analog-to-digital converters.

13. The device of claim 8, wherein each of the input voltages is coupled with an input of a multiplexer, an output of the multiplexer is coupled with an analog-to-digital converter (ADC), an output of the ADC is coupled with a first register to store ADC output values therein, a controller is coupled with the multiplexer and is configured to control the multiplexer, the controller is configured to compare the stored ADC output values from the first register to select the high input voltage, the medium input voltage, the low input voltage, and one or more of the values of the one or more mode signals, and wherein the controller is configured to store values associated with the high input voltage, the medium input voltage, the low input voltage, and the one or more mode signals in a second register.

14. A method of use of a packaged semiconductor device, comprising:
applying a first input voltage to a first input contact;
applying a second input voltage to a second input contact;
comparing the first input voltage with the second input voltage using one or more comparing elements of the device;
using one or more setting elements, selecting one of the input voltages as a high input voltage and another of the input voltages as a low input voltage;
in response to the first input voltage being selected as the high input voltage, setting a mode signal, using the one or more setting elements, to a first value, and;
in response to the second input voltage being selected as the high input voltage, setting the mode signal, using the one or more setting elements, to a second value different from the first value;
wherein selecting the high input voltage and the low input voltage and setting the mode signal to a first value and setting the mode signal to a second value is done using only the first input contact and the second input contact; and
wherein the high input voltage, the low input voltage, and the mode signal are supplied to the electronic component.

15. The method of claim 14, further comprising setting three operating parameters of the device using no input contacts except the first input contact and the second input contact, wherein the three operating parameters are configured to alter an operating condition of an electronic component coupled with the device between one or more states.

16. The method of claim 14, further comprising applying a third input voltage to a third input contact, the third input voltage comprising one of the input voltages, comparing the third input voltage with the first input voltage and the second input voltage using the one or more comparing elements and, using the one or more setting elements, selecting one of the input voltages as a medium input voltage.

17. The method of claim 16, further comprising varying, using the one or more setting elements, multiple mode signals of the device, between at least two values each, in response to which of the input voltages is selected as the high input voltage, which of the input voltages is selected as the medium input voltage, and which of the input voltages is selected as the low input voltage.

18. The method of claim 16, further comprising varying, using the one or more setting elements, the mode signal between at least three values in response to which of the input voltages is selected as the high input voltage, which of the input voltages is selected as the medium input voltage, and which of the input voltages is selected as the low input voltage.

* * * * *